(12) United States Patent
Kanaya

(10) Patent No.: US 8,243,257 B2
(45) Date of Patent: Aug. 14, 2012

(54) POSITION MEASUREMENT SYSTEM, EXPOSURE APPARATUS, POSITION MEASURING METHOD, EXPOSURE METHOD AND DEVICE MANUFACTURING METHOD, AND TOOL AND MEASURING METHOD

(75) Inventor: Yuho Kanaya, Tokyo (JP)

(73) Assignee: Nikon Corporation, Tokyo (JP)

( * ) Notice: Subject to any disclaimer, the term of this patent is extended or adjusted under 35 U.S.C. 154(b) by 1055 days.

(21) Appl. No.: 12/179,007

(22) Filed: Jul. 24, 2008

(65) Prior Publication Data

US 2009/0059194 A1   Mar. 5, 2009

Related U.S. Application Data

(60) Provisional application No. 60/935,341, filed on Aug. 8, 2007.

(30) Foreign Application Priority Data

Jul. 24, 2007   (JP) ................................. 2007-192671

(51) Int. Cl.
*G03B 27/42* (2006.01)
(52) U.S. Cl. ........................................... 355/53; 355/72
(58) Field of Classification Search .................... 355/53, 355/72
See application file for complete search history.

(56) References Cited

U.S. PATENT DOCUMENTS

| | | | |
|---|---|---|---|
| 4,465,368 A | 8/1984 | Matsuura et al. | |
| 4,780,617 A | 10/1988 | Umatate et al. | |
| 5,448,332 A | 9/1995 | Sakakibara et al. | |
| 5,610,715 A | 3/1997 | Yoshii et al. | |
| 5,646,413 A | 7/1997 | Nishi | |
| 5,969,441 A | 10/1999 | Loopstra et al. | |
| 6,208,407 B1 | 3/2001 | Loopstra | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,819,425 B2 | 11/2004 | Kwan | |
| 7,023,610 B2 | 4/2006 | Ohtsuki et al. | |
| 7,025,498 B2 | 4/2006 | Del Puerto | |
| 7,102,729 B2 | 9/2006 | Renkens et al. | |
| 7,161,659 B2 | 1/2007 | Van Den Brink et al. | |

(Continued)

FOREIGN PATENT DOCUMENTS

EP    1 420 298 A2    5/2004

(Continued)

OTHER PUBLICATIONS

Feb. 9, 2010 Written Opinion issued in Application No. PCT/JP2008/001977 (with English translation).

*Primary Examiner* — Toan Ton
*Assistant Examiner* — Mesfin T Asfaw
(74) *Attorney, Agent, or Firm* — Oliff & Berridge, PLC

(57) ABSTRACT

A first grating is placed on the upper surface of wafer stage WST, and on the +Y side of the first grating, a calibration area is arranged where an auxiliary grating is formed. By performing a predetermined calibration process using the calibration area, such as calibration process related to position measurement of the wafer stage using a head and the like of an encoder, it becomes possible to perform position control of the wafer stage in the predetermined direction with good precision using the encoder after the calibration process.

29 Claims, 23 Drawing Sheets

U.S. PATENT DOCUMENTS

| | | |
|---|---|---|
| 7,238,931 B2 | 7/2007 | Nabeshima et al. |
| 7,289,212 B2 | 10/2007 | Kwan |
| 2002/0041377 A1 | 4/2002 | Hagiwara et al. |
| 2002/0041380 A1 | 4/2002 | Kwan |
| 2002/0061469 A1 | 5/2002 | Tanaka |
| 2003/0025890 A1 | 2/2003 | Nishinaga |
| 2004/0263846 A1 | 12/2004 | Kwan |
| 2005/0128461 A1 | 6/2005 | Beems et al. |
| 2005/0236558 A1* | 10/2005 | Nabeshima et al. .......... 250/221 |
| 2006/0023178 A1 | 2/2006 | Loopstra et al. |
| 2006/0139595 A1 | 6/2006 | Koenen et al. |
| 2006/0139660 A1 | 6/2006 | Kwan |
| 2006/0238731 A1 | 10/2006 | Beems et al. |
| 2007/0051160 A1 | 3/2007 | Pril et al. |
| 2007/0195296 A1 | 8/2007 | Van Der Pasch et al. |
| 2007/0263191 A1 | 11/2007 | Shibazaki |
| 2007/0288121 A1 | 12/2007 | Shibazaki |
| 2008/0043212 A1 | 2/2008 | Shibazaki |
| 2008/0088843 A1 | 4/2008 | Shibazaki |

FOREIGN PATENT DOCUMENTS

| | | |
|---|---|---|
| JP | A-57-117238 | 7/1982 |
| JP | A-61-044429 | 3/1986 |
| JP | A-06-283403 | 10/1994 |
| JP | A-07-270122 | 10/1995 |
| JP | A-10-163099 | 6/1998 |
| JP | A-10-214783 | 8/1998 |
| JP | A-11-016816 | 1/1999 |
| JP | A-2000-505958 | 5/2000 |
| JP | A-2001-510577 | 7/2001 |
| JP | A-2001-313250 | 11/2001 |
| JP | A-2002-014005 | 1/2002 |
| JP | A-2004-519850 | 7/2004 |
| JP | A-2005-203483 | 7/2005 |
| JP | A-2007-093546 | 4/2007 |
| JP | A-2007-180553 | 7/2007 |
| WO | WO 99/28790 A1 | 6/1999 |
| WO | WO 99/46835 A1 | 9/1999 |
| WO | WO 99/49504 A1 | 9/1999 |
| WO | WO 01/35168 A1 | 5/2001 |
| WO | WO 03/065428 A1 | 8/2003 |
| WO | WO 2004/053955 A1 | 6/2004 |
| WO | WO 2006/038952 A2 | 4/2006 |
| WO | WO 2007/083758 A1 | 7/2007 |

* cited by examiner

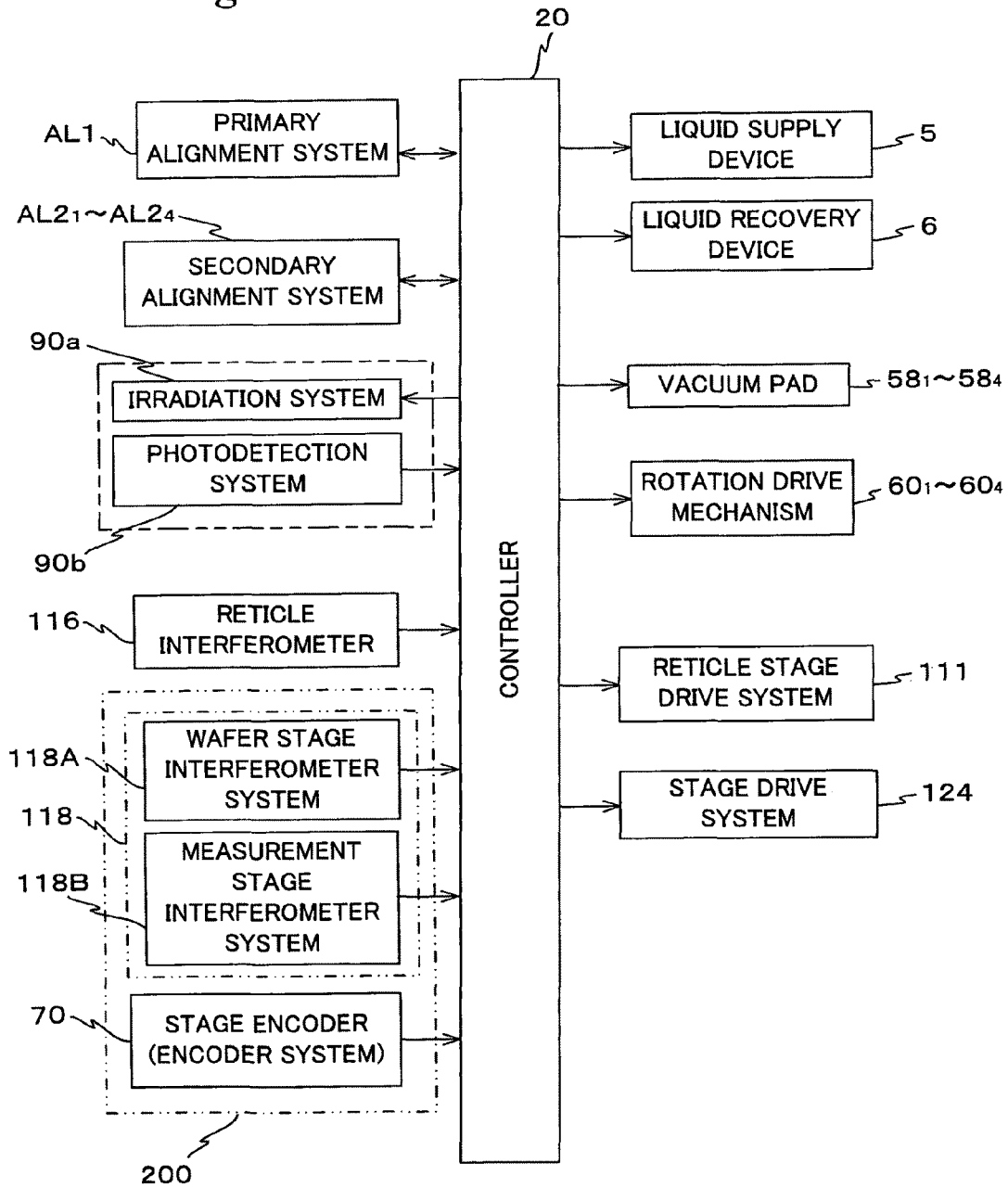

POSITION MEASUREMENT SYSTEM, EXPOSURE APPARATUS, POSITION MEASURING METHOD, EXPOSURE METHOD AND DEVICE MANUFACTURING METHOD, AND TOOL AND MEASURING METHOD

CROSS-REFERENCE TO RELATED APPLICATIONS

This non-provisional application claims the benefit of Provisional Application No. 60/935,341 filed Aug. 8, 2007, the disclosure of which is hereby incorporated herein by reference in its entirety.

BACKGROUND OF THE INVENTION

1. Field of the Invention

The present invention relates to position measurement systems, exposure apparatuses, position measuring methods, exposure methods and device manufacturing methods, and tools and measuring methods, and more particularly, to a position measurement system which measures positional information of a movable body moving within a predetermined plane, an exposure apparatus comprising the system, a position measuring method in which positional information of a movable body moving within a predetermined plane is measured, an exposure method using the method and a device manufacturing method using the exposure method, and a tool which is preferable to measure positional relation of a head of an encoder and a mark detection system, and a measuring method using the tool.

2. Description of the Background Art

In a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are mainly used.

Now, because a semiconductor device or the like is formed by overlaying multilayer circuit patterns on a substrate (a wafer, a glass plate or the like), it is important that the overlay accuracy between each of the layers is good. Therefore, usually, a mark (an alignment mark) is installed in each of a plurality of shot areas on the substrate in advance, and positional information (a position coordinate) of the mark on a stage coordinate system of the exposure apparatus is detected. After the detection, based on the positional information of the mark and positional information already known of a pattern to be newly formed (for example, a reticle pattern), wafer alignment in which a shot area on the substrate is aligned to the pattern is performed. As a method of the wafer alignment, in consideration of throughput, global alignment such as Enhanced Global Alignment (EGA) whose details are disclosed in, for example, Kokai (Japanese Unexamined Patent Application Publication) No. 61-044429 bulletin and the like, has become mainstream.

Meanwhile, in the exposure apparatus, the position of a substrate stage which holds a substrate is usually measured using an interferometer; however, short-term fluctuation of the measurement values of the interferometer due to the temperature change on the beam path of the measurement beam of the interferometer is becoming unignorable. Therefore, there is a trend of using a linear encoder having less short-term fluctuation of the measurement values in comparison with the interferometer as the position measuring device of the substrate stage. However, in the case of measuring the position of a substrate stage that moves within a two-dimensional plane using a linear encoder, it is necessary to employ a placement of the encoder where the encoder does not interfere with the movement of the substrate stage and the beam path also becomes short. As a placement which satisfies such a condition, a placement where a plurality of heads is placed within a plane parallel to the two-dimensional plane along with a grating placed on the substrate stage can be considered. In this case, the position of the substrate stage has to be controlled while switching the plurality of heads, and furthermore, it is necessary to control the position of the substrate stage using the encoder based on the results of the wafer alignment so that the overlay accuracy becomes good. Accordingly, it becomes important to obtain the positional relation between a mark detection system which detects the alignment mark and each of the heads, and the positional relation of the plurality of heads (including the position information between the heads) with good precision.

Further, in order to perform position control of the substrate stage within the two-dimensional plane with good precision, for example, it is also important to control rotation of the substrate stage within the two-dimensional plane. However, in order to perform this rotation control with high accuracy, it is also necessary for reproducibility of the attitude of the substrate stage to be good at the time of reset.

SUMMARY OF THE INVENTION

According to a first aspect of the present invention, there is provided a first position measurement system which measures positional information of a movable body moving within a predetermined planar surface, the system comprising: a first grating placed on a predetermined plane parallel to the predetermined planar surface of one of the movable body and the outside of the movable body, including a grating whose periodic direction is in a predetermined direction; a calibration area that was arranged at a position which is different from the first grating on the predetermined plane; and an encoder that has at least one head arranged at the other of the movable body and the outside of the movable body, and measures positional information of the movable body in the predetermined direction, based on an output of a head that faces the first grating.

According to this system, the first grating is placed on a predetermined plane of one of the movable body and the outside of the movable body, and a calibration area is arranged at a position which is different from the first grating on the predetermined surface. Accordingly, by performing a predetermined calibration process using the calibration area, such as some kind of a calibration process related to the position of the encoder head or the movable body, it becomes possible to perform position control of the movable body in the predetermined direction with good precision using the encoder after the calibration process.

According to a second aspect of the present invention, there is provided a second position measurement system which measures positional information of a movable body moving within a predetermined planar surface, the system comprising: a grating which is placed on a predetermined plane parallel to the planar surface of the movable body, including a grating whose periodic direction is in a predetermined direction; and a calibration area which is arranged on one side of the predetermined direction of the grating on the predetermined planar surface.

According to this system, a grating is placed on a predetermined plane of the movable body, and a calibration area is arranged on one side of a predetermined direction of the grating. Accordingly, a predetermined calibration process using the calibration area can be performed, moving the movable body.

According to a third aspect of the present invention, there is provided an exposure apparatus that exposes an object and forms a predetermined pattern, the apparatus comprising: a movable body which holds the object and moves within a predetermined planar surface; and a position measurement system according to one of the first and second position measurement systems described above which measures positional information of the movable body.

According to this apparatus, for example, in the case the calibration described above is performed prior to the beginning of an exposure, and exposure of the object is performed after the calibration, it becomes possible to control the position of the movable body on the exposure with good precision using the position measurement system.

According to a fourth aspect of the present invention, there is provided an exposure apparatus that exposes an object and forms a predetermined pattern, the apparatus comprising: a movable body which holds the object and moves within a predetermined planar surface; a first grating placed on a predetermined plane parallel to the predetermined planar surface of one of the movable body and the outside of the movable body, including a grating whose periodic direction is in a predetermined direction; an encoder that has at least one head arranged at the other of the movable body and the outside of the movable body, and measures positional information of the movable body in the predetermined direction, based on an output of a head that faces the first grating; a pattern generation device which forms a pattern on the object; a mark detection device that detects marks on the object; and a calibration area arranged at a position on the predetermined plane where the head faces at a predetermined time when neither formation of a pattern to the object by the pattern generation device nor detection of a mark on the object by the mark detection device is performed.

According to this apparatus, a calibration area is arranged at a position on the predetermined plane where the head faces at a predetermined time when neither formation of a pattern to the object by the pattern generation device nor detection of a mark on the object by the mark detection device is performed. Therefore, because of the presence of the calibration area, while measurement operation of the positional information of the movable body by the head is not adversely affected during the normal movement of the movable body where mark detection or pattern formation is performed, when both the mark detection and the pattern formation are not performed, calibration of the encoder can be performed.

According to a fifth aspect of the present invention, there is provided a position measuring method in which positional information of a movable body moving within a predetermined planar surface is measured, the method comprising: a first process in which on a grating section placed on a predetermined plane parallel to the planar surface of one of the movable body and the outside of the movable body whose periodic direction is in a predetermined direction, a light beam is irradiated from a head of an encoder arranged at the other of the movable body and the outside of the movable body, and a photoelectric conversion signal of a photodetection system receiving diffraction light from the grating section is taken in, while driving the movable body in a predetermined direction within a plane parallel to the planar surface; and a second process in which positional information of a reference point on the grating section in the predetermined direction is computed, based on the photoelectric conversion signal and a predetermined threshold.

According to this method, a light beam is irradiated from a head of an encoder on a grating section placed on a predetermined plane parallel to the planar surface of the movable body whose periodic direction is in a predetermined direction, while driving the movable body in a predetermined direction within a plane parallel to the predetermined planar surface. Then, positional information of the reference point of the movable body in the predetermined direction is computed, based on the photoelectric conversion signal and the predetermined threshold. This allows positional information of the reference point of the movable body in the predetermined direction to be obtained with good precision, which in turn, makes it possible to obtain positional information of the head in the predetermined direction with good precision. Accordingly, by controlling the position of the movable body in the predetermined direction based on the measurement values of the head, position control with high precision becomes possible.

According to a sixth aspect of the present invention, there is provided an exposure method in which a predetermined pattern is formed by exposing an object, the method comprising: a measuring process in which positional information of a movable body that moves within a predetermined planar surface holding the object is measured using the position measuring method described above; and a control process in which position of the movable body is controlled, taking into consideration the measurement results for formation of the pattern to the object.

According to this method, because the position of the movable body that moves within a predetermined planar surface holding the object is controlled, taking into consideration the measurement results for formation of the pattern to the object, it becomes possible to form a pattern on an object with good precision.

According to a seventh aspect of the present invention, there is provided a tool installed on a movable body which can face a head of an encoder and a mark detection system from the same direction, the tool comprising: a plate consisting of an optically-transparent material, wherein a mark detectable by the mark detection system is formed on one surface of the plate, and on the other surface of the plate at a position excluding an area where the mark faces, a grating which the head can face is formed.

According to this tool, it is equipped on a movable body which can face a head of an encoder and a mark detection system from the same direction. Then, the movable body is driven so that positional information of a mark formed on one surface of the tool is detected by the mark detection system, and then the movable body is driven so that the head of the encoder faces the grating which is formed on the other surface of the plate, and positional information of the grating is detected based on the output of the head. After such detection operations, positional relation between a detection center of the mark detection system and the head is computed, based on a positional relation between the mark and the grating, positional information of the mark which has been detected, and positional information of the grating. This allows the positional relation between the detection center of the mark detection system and the head to be obtained with good precision.

According to an eighth aspect of the present invention, there is provided a measuring method, the method comprising: a first process in which a tool is installed on a movable body which can face a head of an encoder and a mark detection system from the same direction; a second process in which positional information of the mark is detected by the detection system by driving the movable body; a third process in which the movable body is driven so as to make the head of the encoder face the grating, and positional information of the grating is detected based on an output of the head; and a fourth process in which positional relation between a detection center of the mark detection system and the head is computed, based on a positional relation between the mark and the grating, positional information of the mark, and positional information of the grating.

According to this method, the positional relation between the detection center of the mark detection system and the head can be obtained with good precision.

BRIEF DESCRIPTION OF THE DRAWINGS

In the accompanying drawings;

FIG. 4 is a block diagram that shows a control system of the exposure apparatus in the first embodiment;

DESCRIPTION OF THE EMBODIMENTS

A First Embodiment

A first embodiment of the present invention will be described below, with reference to FIGS. 1 to 14C.

Figure 1:
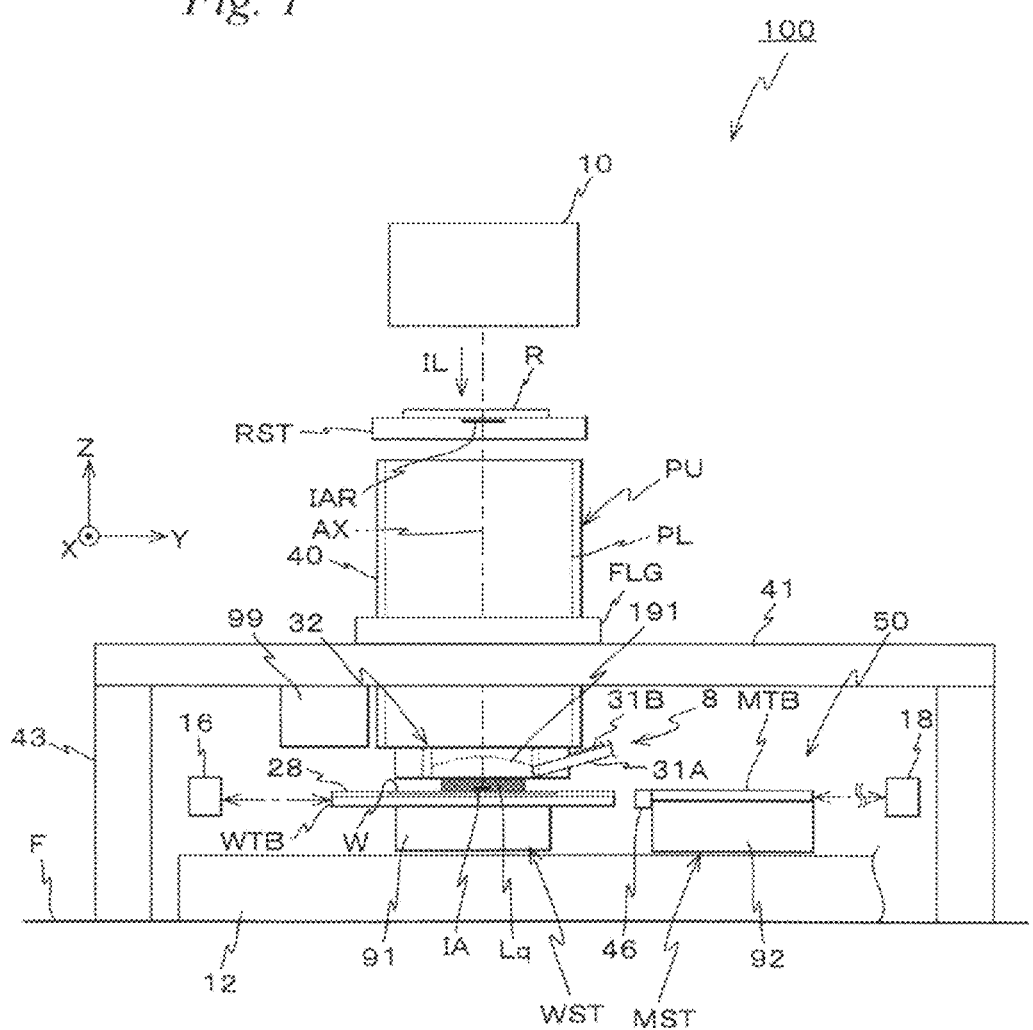
FIG. 1 is a view that schematically shows a configuration of an exposure apparatus of a first embodiment.

FIG. 1 schematically shows a configuration of an exposure apparatus 100 related to the first embodiment. Exposure apparatus 100 is a scanning exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 includes an illumination system 10, a reticle stage RST that holds a reticle R that is illuminated by an illumination light for exposure (hereinafter, referred to as illumination light, or exposure light) IL from illumination system 10, a projection unit PU that includes projection optical system PL that projects illumination light IL emitted from reticle R on a wafer W, a stage device 50 that has a wafer stage WST and a measurement stage MST, their control system, and the like. On wafer stage WST, wafer W is mounted.

Stage device 50 is equipped with a wafer stage WST and a measurement stage MST placed on a base board 12 set on floor surface F, a stage drive system 124 (not shown in FIG. 1, refer to FIG. 4) which drives the stages WST and MST, and a position measurement system 200 (not shown in FIG. 1, refer to FIG. 4) which has a stage interferometer system 118 (refer to FIG. 4) including Y-axis interferometers 16 and 18 which measure positional information of stages WST and MST, and an encoder system (a stage encoder) 70 to be described later which measures positional information of wafer stage WST at times such as on exposure, and the like.

On the bottom surface of each of wafer stage WST and measurement stage MST, for example, a vacuum preload type hydrostatic air bearing (hereinafter, referred to as an "air pad") is arranged at a plurality of points, and by these air pads, wafer stage WST and measurement stage MST are supported in a noncontact manner via a clearance of around several μm above base board 12.

Wafer stage WST, for example, includes a stage main section 91, which is movable by a plurality of linear motors within the XY plane, or more specifically, in the X-axis direction, the Y-axis direction, and the θz direction, and a wafer table WTB, which is mounted on stage main section 91 via a Z-leveling mechanism (not shown) (such as a voice coil motor) and is finely driven relative to stage main section 91 in the Z-axis direction, the θx direction, and the θy direction. A wafer stage drive system which makes up a part of stage drive system 124 is configured, including the plurality of linear motors and the voice coil motor described above.

Figure 2:
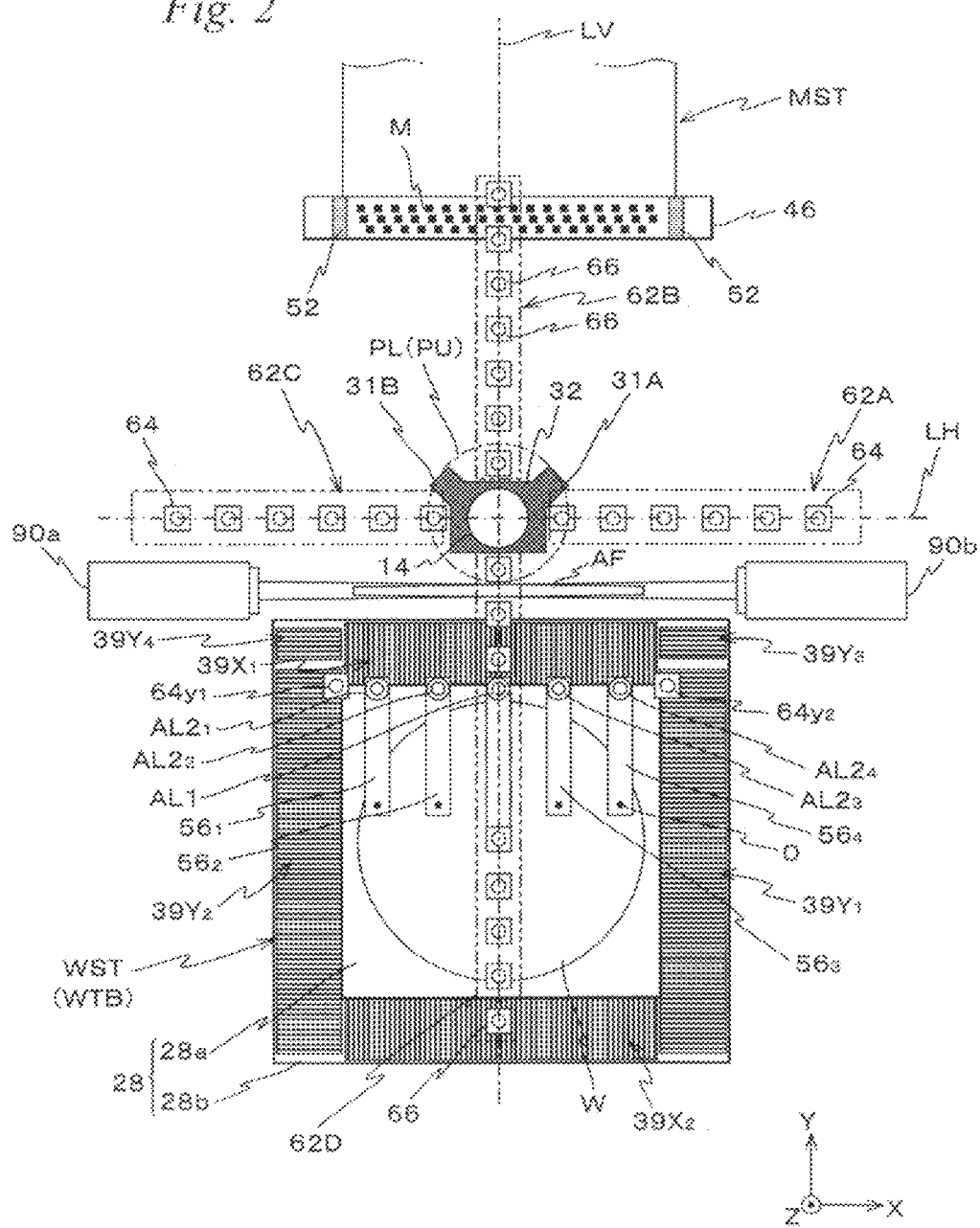
FIG. 2 is planar view showing a placement of a wafer stage, a measurement stage, and various measurement devices (a stage encoder, an alignment system, a multipoint AF system and the like) equipped in the exposure apparatus in FIG. 1.

On wafer table WTB, a wafer holder (not shown) which holds wafer W by vacuum suction or the like, as in, for example, the pin chuck method is arranged. The wafer holder may also be formed integrally with wafer table WTB, but in the embodiment, the wafer holder and wafer table WTB are separately configured, and the wafer holder is fixed inside a recessed portion of wafer table WTB, for example, by vacuum suction or the like. Further, on the upper surface of wafer table WTB, a plate (liquid repellent plate) 28 is arranged, which has the surface (liquid repellent surface) substantially flush with the surface of the wafer mounted on the wafer holder to which liquid repellent processing with respect to a liquid Lq (to be described later on) is performed, has a rectangular outer shape (contour), and has a circular opening that is formed in the center portion and is slightly larger than the wafer holder (a mounting area of the wafer). This plate 28 is made of materials with a low coefficient of thermal expansion, such as glasses or ceramics (such as Zerodur (the brand name) of Schott AG, $Al_2O_3$, or TiC), and on the surface of plate 28, a liquid repellent film is formed by, for example, fluorine resin materials, fluorine series resin materials such as polytetrafluoroethylene (Teflon (registered trademark)), acrylic resin materials, or silicon series resin materials. Furthermore, as shown in FIG. 2, plate 28 has a first liquid repellent area 28a whose outer shape (contour) is rectangular enclosing a circular opening, and a second liquid repellent area 28b that has a rectangular frame (annular) shape placed around the first liquid repellent area 28a. On first liquid repellent area 28a, for example, at the time of an exposure operation, at least part of a liquid immersion area 14 that is protruded from the surface of the wafer is formed, and on second liquid repellent area 28b, scales for an encoder system (to be described later) are formed. Incidentally, at least part of the surface of plate 28 does not have to be flush with the surface of the wafer, that is, may have a different height from that of the surface of the wafer. Further, plate 28 may be a single plate, but in the embodiment, plate 28 is configured by combining a plurality of plates, for example, the first and second liquid repellent plates that correspond to the first liquid repellent area 28a and the second liquid repellent area 28b respectively. In the embodiment, because pure water will be used as liquid Lq as it will be described later on, hereinafter, the first liquid repellent area 28a and the second liquid repellent area 28b will also be referred to as a first water repellent plate 28a and a second water repellent plate 28b.

On the upper surface of the second water repellent plate 28b, multiple grid lines are directly formed in a predetermined pitch along each of the four sides, as shown in FIG. 2. More specifically, in areas on one side and the other side in the X-axis direction of the second water repellent plate 28b (both sides in the horizontal direction in FIG. 2), Y scales $39Y_1$ and $39Y_2$ are formed in a symmetric arrangement. Y scales $39Y_1$ and $39Y_2$ are placed on the area on one side and the other side of the X-axis direction of the second water repellent board 28b, excluding the end on the +Y side. On the end (near the edge) on the +Y side of the second water repellent board 28b on one side and the other side in the X-axis direction, auxiliary scales $39Y_3$ and $39Y_4$ are formed distanced by a predetermined spacing from Y scales $39Y_1$ and $39Y_2$, respectively. A clearance area (an area without a grid line) of the same size is arranged between Y scale $39Y_1$ and auxiliary scale $39Y_3$, and Y scale $39Y_2$ and auxiliary scale $39Y_4$. In the embodiment, the area on the +Y side of each of the Y scales $39Y_1$ and $39Y_2$ (including the area where auxiliary scales $39Y_3$ and $39Y_4$ are formed) is a calibration area.

Y scales $39Y_1$ and $39Y_2$ are each composed of a reflective grating (for example, a diffraction grating) having a periodic direction in the Y-axis direction in which grid lines having the longitudinal direction in the X-axis direction are formed in a predetermined pitch, such as, for example, a pitch between 138 nm and 4 μm, as in a 1 μm pitch, along the Y-axis direction.

Further, auxiliary scales $39Y_3$ and $39Y_4$ are also composed of a reflective grating (for example, a diffraction grating) having a periodic direction in the Y-axis direction in which grid lines having the longitudinal direction in the X-axis direction are formed in a predetermined pitch (the pitch does not necessarily have to be the same as the pitch of the grid lines of Y scales $39Y_1$ and $39Y_2$, however, in this case, the pitch is the same pitch 1 μm) along the Y-axis direction. Size L1 (refer to FIG. 7A) in the Y-axis direction of auxiliary scales $39Y_3$ and $39Y_4$ should be larger than the size of a laser beam LB (refer to FIG. 7A) in the Y-axis direction irradiated from a head of an encoder, which will be described later, such as, for example, larger than 2 mm, and in actual practice, size L1 is around several mm, however, in FIG. 2 and the like, for the sake of convenience and to indicate the existence of the grating, size L1 is illustrated larger than the actual size. Further, size L2 (refer to FIG. 7A) in the Y-axis direction of the clearance area previously described is set larger than the size of laser beam LB in the Y-axis direction, which is, for example, 2 mm.

Similarly, in areas on one side and the other side of the Y-axis direction of the second water repellent board 28b (both sides in the vertical direction in FIG. 2), scales $39X_1$ and $39X_2$ are formed, respectively, in a state where scales $39X_1$ and $39X_2$ are arranged between a pair of auxiliary scales $39Y_3$ and $39Y_4$, and Y scales $39Y_1$ and $39Y_2$, respectively. X scales $39X_1$ and $39X_2$ are each composed of a reflective grating (for example, a diffraction grating) having a periodic direction in the X-axis direction in which grid lines having the longitudinal direction in the Y-axis direction are formed in a predetermined pitch, such as, for example, a pitch between 138 nm and 4 μm, as in a 1 μm pitch, along the X-axis direction.

As each of the scales above, the scale made up of a reflective diffraction grating RG (refer to FIGS. 3A and 3B) that is created by, for example, hologram or the like on the surface of the second water repellent plate 28b is used. In this case, each scale has gratings made up of narrow slits, grooves or the like that are marked at a predetermined distance (the pitch described above) as graduations. The type of diffraction grating used for each scale is not limited, and not only the diffraction grating made up of grooves or the like that are mechanically formed, but also, for example, the diffraction grating that is created by exposing interference fringe on a photosensitive resin may be used. However, each scale is created by marking the graduations of the diffraction grating in the pitch described above on a thin plate shaped glass. These scale surfaces are covered with a cover glass of a predetermined thickness, such as, for example, 1 mm, and the cover glass is covered with the liquid repellent film (the water-repellent film) previously described. Incidentally, the pitch of the grating is shown much wider in FIG. 2 than the actual pitch, for the sake of convenience. The same is true also in other drawings. Further, in the embodiment, each scale is arranged so that the surface of the cover glass is set at substantially the same height as the surface of wafer W.

In this manner, in the embodiment, since the second water repellent plate 28*b* itself constitutes the scales, a glass plate with low-thermal expansion is to be used as the second water repellent plate 28*b*. However, the present invention is not limited to this, and a scale member made up of a glass plate or the like with low-thermal expansion on which a grating is formed may also be fixed on the upper surface of wafer table WTB, for example, by a plate spring (or vacuum suction) or the like so as to prevent local shrinkage/expansion. In this case, a water repellent plate to which the same water repellent coat is applied on the entire surface may be used instead of plate 28. Or, wafer table WTB may also be formed by materials with a low coefficient of thermal expansion, and in such a case, a pair of Y scales and a pair of X scales may be directly formed on the upper surface of wafer table WTB.

Referring back to FIG. 1, mirror-polishing is applied to the −Y edge surface and the −X edge surface of wafer table WTB, respectively, and reflection surfaces are formed. Wafer stage interferometer system 118A (FIG. 1 shows only Y-axis interferometer 16, which is a part of the system, refer to FIG. 4) which configures a part of stage interferometer system 118, projects a plurality of interferometer beams (measurement beams) on these reflection surfaces, and measures positional information (for example, including positional information in the X-axis, the Y-axis, and the Z-axis directions, and rotation information in the θx, the θy, and the θz directions) of wafer stage WST, and the measurement values are supplied to a controller 20 (not shown in FIG. 1, refer to FIG. 4). Incidentally, details of wafer stage interferometer system (hereinafter, shortly referred to as an interferometer system) 118A are disclosed as in, for example, Kohyo (Japanese Patent Unexamined Application Publication) No. 2001-510577 bulletin (corresponding to the pamphlet of International Publication No. 99/28790). Further, position control of wafer stage WST (wafer W) within the XY plane can be performed using only interferometer system 118A, or using both interferometer system 118A and an encoder system 70 to be described later, however, in the embodiment, position control of wafer stage WST is to be performed using only encoder system 70 at least during the exposure operation, and interferometer system 118A is to be used in predetermined operations except for the exposure operation, such as, for example, calibration operation of encoder system 70, measurement operation of the head position of encoder system 70, a reset operation of the stage or the like.

Measurement stage MST includes, for example, a stage main section 92, which moves within the XY plane by a linear motor or the like, and a measurement table MTB mounted on stage main section 92 via a Z-leveling mechanism (not shown). A measurement stage drive system which makes up a part of stage drive system 124 is configured, including the linear motor and the like and the Z-leveling mechanism.

Although not shown in the drawings various types of measurement members are arranged at measurement table MTB (and stage main section 92). As such measurement members, for example, members such as an uneven illuminance measuring sensor that has a pinhole-shaped light-receiving section which receives illumination light IL on an image plane of projection optical system PL, an aerial image measuring instrument that measures an aerial image (projected image) of a pattern projected by projection optical system PL, a wavefront aberration measuring instrument by the Shack-Hartman method that is disclosed in, for example, the pamphlet of International Publication No. 03/065428 and the like are employed. As the uneven illuminance measuring sensor, a sensor having a configuration similar to the one that is disclosed in, for example, Kokai (Japanese Unexamined Patent Application Publication) No. 57-117238 bulletin (the corresponding U.S. Pat. No. 4,465,368 description) and the like can be used. Further, as the aerial image measuring instrument, an instrument having a configuration similar to the one that is disclosed in, for example, Kokai (Japanese Unexamined Patent Application Publication) No. 2002-014005 (the corresponding U.S. Patent Application Publication No. 2002/0041377) and the like can be used. In addition to each of the sensors described above, an illuminance monitor that has a light-receiving section having a predetermined area size that receives illumination light IL on the image plane of projection optical system PL may also be employed, which is disclosed in, for example, Kokai (Japanese Unexamined Patent Application Publication) No. 11-016816 (the corresponding U.S. Patent Application Publication No. 2002/0061469) and the like.

On the −Y side edge surface of measurement table MTB, a fiducial bar (hereinafter shortly referred to as an "FD bar") 46, which is made up of a bar-shaped member having a rectangular sectional shape and serves as a reference member, is arranged extending in the X-axis direction.

Since FD bar 46 serves as a prototype standard (measurement standard), optical glass ceramics with a low coefficient of thermal expansion, such as Zerodur (the brand name) of Schott AG are employed as the materials. Further, the flatness degree of the upper surface (the surface) of FD bar 46 is set high to be around the same level as a so-called reference plane plate, and also as shown in FIG. 2, in the vicinity of one end and the other end in the longitudinal direction of FD bar 46, reference gratings (for example, diffraction gratings) 52 whose periodic direction is in the Y-axis direction are formed, respectively.

Further, on the upper surface of FD bar 46, a plurality of reference marks M is formed in the placement as shown in FIG. 2. The plurality of reference marks M are formed in three-row arrays in the Y-axis direction in the same pitch, and the array of each row is formed being shifted from each other by a predetermined distance in the X-axis direction. As each of reference marks M, a two-dimensional mark having a size that can be detected by a primary alignment system and secondary alignment systems (to be described later) is used. Incidentally, in the embodiment, the surface of FD bar 46 and the surface of measurement table MTB (which may include the measurement members described above) are also covered with a liquid repellent film (water repellent film) severally.

Similar to wafer table WTB described above, reflection surfaces are formed on the +Y edge surface and the −X edge surface of measurement table MTB. A measurement stage interferometer system 118B (FIG. 1 shows only Y-axis interferometer 18, which is a part of the system, refer to FIG. 4) projects a plurality of interferometer beams (measurement beams) on these reflection surfaces, and measures positional information (for example, including positional information in at least the X-axis, the Y-axis, and rotation information in the θz direction) of measurement stage MST, and the measurement values are supplied to a controller 20. Measurement stage interferometer system 118B is configured similar to interferometer system 118A.

In exposure apparatus 100 of the embodiment, as shown in FIG. 2, a primary alignment system AL1 is arranged on a straight line LV, which passes through the center of projection unit PU (optical axis AX of projection optical system PL, which also coincides with the center of exposure area IA (to be described later, refer to FIG. 1) in the embodiment) and is also parallel to the Y-axis, the system having a detection center at a position that is spaced apart from the optical axis at a predetermined distance on the −Y side. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to straight line LV are severally arranged. That is, five alignment systems AL1 and $AL2_1$ to $AL2_4$ are placed so that their detection centers are placed along the X-axis direction.

As is representatively shown by secondary alignment system $AL2_4$, each secondary alignment system $AL2_n$ (n=1 to 4) is fixed to a tip (turning end) of an arm $56_n$ (n=1 to 4) that can turn around a rotation center O as the center in a predetermined angle range in clockwise and anticlockwise directions in FIG. 2. In the embodiment, a part of each secondary alignment system $AL2_n$ (for example, including at least an optical system that irradiates an alignment light to a detection area and also leads the light that is generated from a subject mark within the detection area to a light-receiving element) is fixed to arm $56_n$ and the remaining section is arranged at the main frame that holds projection unit PU. The X-positions of secondary alignment systems $AL2_1$, $AL2_2$, $AL2_3$ and $AL2_4$ are severally adjusted by rotating around rotation center O as the center. In other words, the detection areas (or the detection centers) of secondary alignment systems $AL2_1$, $AL2_2$, $AL2_3$, and $AL2_4$ are independently movable in the X-axis direction. Accordingly, the relative positions of the detection areas of primary alignment system AL1 and secondary alignment systems $AL2_1$, $AL2_2$, $AL2_3$, and $AL2_4$ are adjustable in the X-axis direction. Incidentally, in the embodiment, the X-positions of secondary alignment systems $AL2_1$, $AL2_2$, $AL2_3$, and $AL2_4$ are to be adjusted by the rotation of the arms. However, the present invention is not limited to this, and a drive mechanism that drives secondary alignment systems $AL2_1$, $AL2_2$, $AL2_3$, and $AL2_4$ back and forth in the X-axis direction may also be arranged. Further, at least one of secondary alignment systems $AL2_1$, $AL2_2$, $AL2_3$, and $AL2_4$ can be moved not only in the X-axis direction but also in the Y-axis direction. Incidentally, since part of each secondary alignment system $AL2_n$ is moved by arm $56_n$, positional information of the part that is fixed to arm $56_n$ is measurable by a sensor (not shown) such as, for example, an interferometer or an encoder. The sensor may only measure position information in the X-axis direction of secondary alignment system $AL2_n$, or may be capable of measuring position information in another direction, for example, the Y-axis direction and/or the rotation direction (including at least one of the θx and θy directions).

On the upper surface of each arm $56_n$, a vacuum pad $58_n$ (n=1 to 4, not shown in FIG. 2, refer to FIG. 4) that is composed of a differential evacuation type air bearing is arranged. Further, arm $56_n$ can be turned by a rotation drive mechanism $60_n$ (n=1 to 4, not shown in FIG. 2, refer to FIG. 4) that includes, for example, a motor or the like, in response to instructions of controller 20. Controller 20 activates each vacuum pad $58_n$ to fix each arm $56_n$ to a main frame (not shown) by suction after rotation adjustment of arm $56_n$. Thus, the state of each arm $56_n$ after rotation angle adjustment, that is, a desired positional relation between primary alignment system AL1 and four secondary alignment systems $AL2_1$ to $AL2_4$ is maintained.

Incidentally, in FIG. 1, the five alignment systems AL1 and $AL2_1$ to $AL2_4$, including the holding apparatuses holding these systems, are shown as an aligner 99. In the embodiment, although aligner 99 is arranged at a mainframe 41, in the case the exposure apparatus in FIG. 1 employs a configuration where projection unit PU is supported in a suspended state with respect to mainframe 41, for example, aligner 99 can be supported in a suspended state integrally with projection unit PU, or aligner 99 can be arranged independently from projection unit PU at the measurement frame, supported in a suspended state from mainframe 41.

Furthermore, in exposure apparatus 100 of the embodiment, as shown in FIG. 2, four head units 62A to 62D of encoder system 70 are placed on four sides of a nozzle unit 32 which configures a part of a local liquid immersion device (to be described later). In actual, although it is omitted in the drawings such as FIG. 2 and the like from the viewpoint of avoiding intricacy of the drawings, head units 62A to 62D are actually fixed to mainframe 41 previously described (refer to FIG. 1) in a suspended state via a support member (not shown). Incidentally, in the case when the exposure apparatus in FIG. 1 employs a configuration where projection unit PU is supported in a suspended state with respect to mainframe 41 as previously described, for example, head units 62A to 62D can be supported in a suspended state integrally with projection unit PU, or head units 62A to 62D can be arranged independently from projection unit PU at the measurement frame, supported in a suspended state from mainframe 41. Especially in the latter case, head units 62A to 62D and aligner 99 can each be arranged independently at the measurement frame, which is supported in a suspended state.

Head units 62A and 62C are respectively placed on the +X side and −X side of projection unit PU having the longitudinal direction in the X-axis direction, and are also placed apart at the substantially same distance from optical axis AX of projection optical system PL symmetrically with respect to optical axis AX of projection optical system PL. Further, head units 62B and 62D are respectively placed on the +Y side and −Y side of projection unit PU having the longitudinal direction in the Y-axis direction, and are also placed along straight line LV previously described which passes through optical axis AX of projection optical system PL, apart from optical axis AX of projection optical system PL at substantially the same distance.

Head units 62A and 62C are each equipped with a plurality of (six in this case) Y heads 64 that are placed at a predetermined distance on a straight line LH that passes through optical axis AX of projection optical system PL and is parallel to the X-axis. Head unit 62A (62C) constitutes a multiple-lens (six-lens, in this case) Y linear encoder that measures the position (Y position) of wafer stage WST (wafer table WTB) in the Y-axis direction, using Y scale $39Y_1$ ($39Y_2$) previously described. In this case, the spacing between adjacent Y heads 64 (measurement beams) is set smaller than the width of Y scales $39Y_1$ and $39Y_2$ previously described in the X-axis direction. Further, head unit 62A (62C) is also used in a measurement and the like, which will be described later, using auxiliary scale $39Y_3$ ($39Y_4$).

Head unit 62B is equipped with a plurality of (in this case, seven) X heads 66, placed at a predetermined spacing on straight line LV described above. Further, head unit 62D is equipped with a plurality of (eleven in this case) (however, out of the eleven X heads, three X heads that overlap primary alignment system AL1 are not shown in FIG. 2) X heads 66 that are placed on straight line LV at a predetermined spacing. Head unit 62B (62D) constitutes a multiple-lens (seven-lens (eleven-lens), in this case) X linear encoder that measures the position in the X-axis direction (the X-position) of wafer stage WST (wafer table WTB) using X scale $39X_1$ ($39X_2$) previously described. Incidentally, the spacing between adjacent X heads 66 (measurement beams) is set smaller than the width of X scales $39X_1$ and $39X_2$ previously described in the Y-axis direction.

Furthermore, on the −X side of secondary alignment sensor $AL2_1$ and on the +X side of secondary alignment sensor $AL2_4$, Y heads $64y_1$ and $64y_2$ are respectively arranged, whose detection points are placed on a straight line parallel to the X-axis that passes through the detection center of primary alignment system AL1 and are substantially symmetrically placed with respect to the detection center. In the state shown in FIG. 2 where the center of wafer W on wafer stage WST is on straight line LV, Y heads $64y_1$ and $64y_2$ face Y scales $39Y_2$ and $39Y_1$, respectively. On an alignment operation (to be described later) or the like, Y scales $39Y_2$ and $39Y_1$ are placed facing Y heads $64y_1$ and $64y_2$ respectively, and the Y-position (and the θz rotation) of wafer stage WST is measured by Y heads $64y_1$ and $64y_2$ (Y linear encoders). Further, Y heads $64y_1$ and $64y_2$ are also used in the measurement (to be described later) using auxiliary scales $39Y_4$ and $39Y_3$ for restoring the θz rotation at the time of reset of wafer stage WST.

The measurement values of each of the linear encoders described above are supplied to controller 20, and controller 20 controls the position of wafer table WTB within the XY plane, based on the measurement values of each of the linear encoders. Incidentally, at least during the exposure operation, as well as position control of the position of wafer stage WST within the XY plane (the X-axis, the Y-axis, and the θz directions) using encoder system 70 previously described, position control of wafer stage WST in the Z-axis, the θx, and the θy directions can be performed using other measurement devices. In this case, as other measurement devices, interferometer system 118A previously described, or a multiple point focal position detection system and the like disclosed in, for example, Kokai (Japanese Patent Unexamined Application Publication) No. 6-283403 (corresponding U.S. Pat. No. 5,448,332) and the like can be used. In the case of arranging this multiple point focal position detection system, at least a part of a plurality of measurement points can be set within liquid immersion area 14 (or exposure area IA which will be described later on), or all the measurement points can be set outside of liquid immersion area 14.

Further, in the embodiment, at the time of baseline measurement of the secondary alignment systems (to be described later) or the like, a pair of reference gratings 52 of FD bar 46 face Y heads $64y_1$ and $64y_2$ respectively, and the Y-position of FD bar 46 is measured by Y heads $64y_1$ and $64y_2$ and the pair of reference gratings 52. These measurement values are supplied to controller 20 (not shown), and controller 20 controls the θz rotation of FD bar 46 based on these measurement values.

In the embodiment, because the arrangement of the X heads and Y heads described above is employed, in the effective stroke range (a range in which the stage moves for alignment and exposure operation) of wafer stage WST, X scales $39X_1$ and $39X_2$ face head units 62B and 62D (X head 66), respectively, without fail, and Y scales $39Y_1$ and $39Y_2$ face head units 62A and 62C (Y head 64) or Y heads $64y_1$ and $64y_2$, respectively. Incidentally, in FIG. 2, for the convenience of the drawing, although projection unit PU and alignment systems AL1 and $AL2_1$ to $AL2_4$ are shown distanced apart in the Y-axis direction, alignment systems AL1 and $AL2_1$ to $AL2_4$ are actually placed closer to projection unit PU than when compared to FIG. 2.

Therefore, by controlling the linear motor and the like that drive wafer stage WST based on the measurement values of these encoders in the effective stroke range of wafer stage WST, controller 20 can control the position (including the θz rotation) of wafer stage WST within the XY plane with high precision. Further, when wafer stage WST moves within the effective stroke range, the measurement values of the X head or the Y head just before the opposing state with the X scale or the Y scale is released are succeeded to the measurement values of the X head or the Y head that newly face the X scale or the Y scale.

Figure 3A:
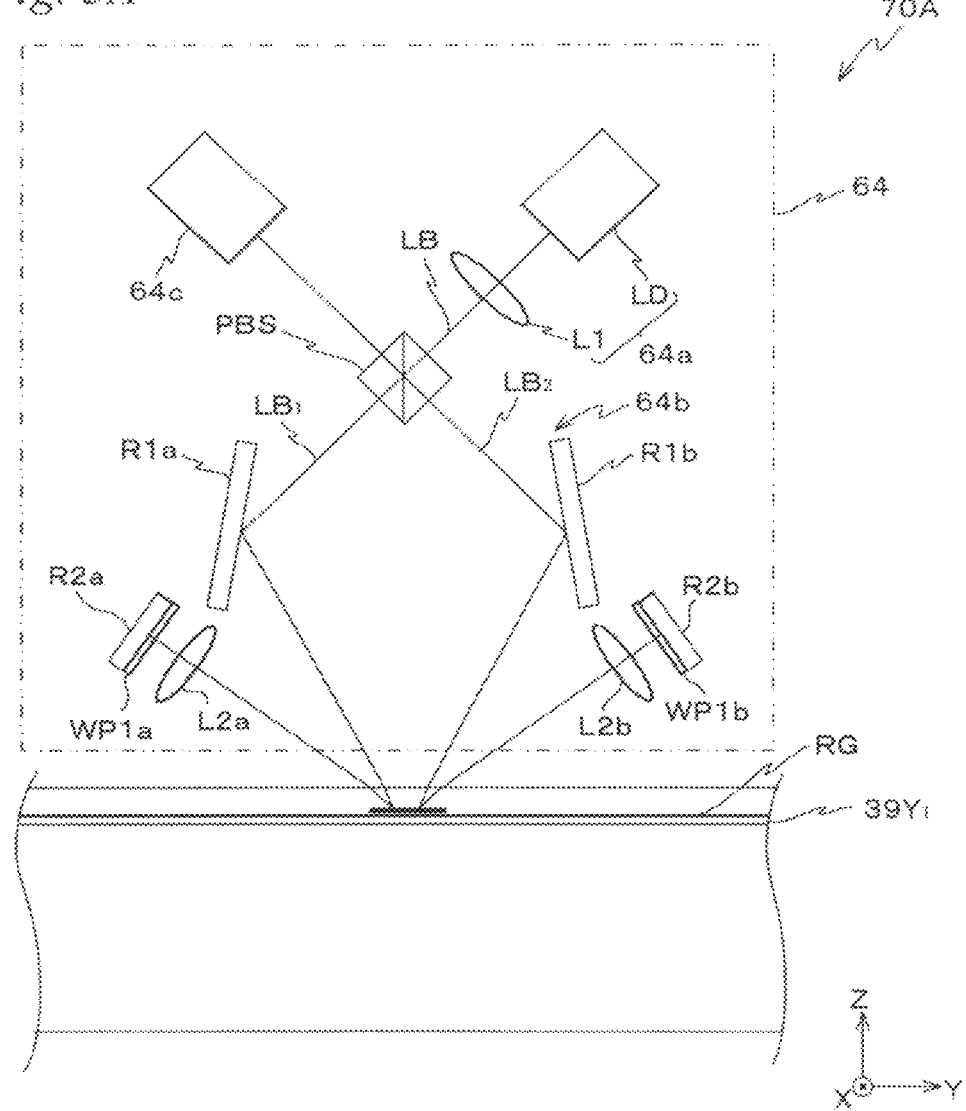
FIG. 3A is a view showing an example of a configuration of an encoder.

Incidentally, encoder system 70 having the head unit described above will hereinafter be appropriately referred to as a "stage encoder 70 (refer to FIG. 4)," including the scale previously described. Next, a configuration and the like of stage encoder 70 will be described, representatively taking up a Y encoder 70A shown enlarged in FIG. 3A that constitutes a part of stage encoder 70. In this case, an encoder which is configured including head unit 62A that irradiates a detection beam (a measurement beam) on Y scale $39Y_1$ is to be referred to as Y encoder 70A, for the sake of convenience. FIG. 3A shows one Y head 64 of head unit 62A that irradiates a detection beam (a measurement beam) on Y scale $39Y_1$.

Y head 64 is mainly composed of three sections, which are an irradiation system 64a, an optical system 64b and a photodetection system 64c.

Irradiation system 64a includes a light source that emits a laser beam LB in a direction inclined at an angle of 45 degrees with respect to the Y-axis and Z-axis, for example, a semiconductor laser LD, and a lens L1 that is placed on the optical path of laser beam LB emitted from semiconductor laser LD.

Optical system 64b is equipped with a polarization beam splitter PBS whose separation plane is parallel to an XZ plane, a pair of reflection mirrors R1a and R1b, lenses L2a and L2b, quarter wavelength plates (hereinafter, referred to as a λ/4 plate) WP1a and WP1b, refection mirrors R2a and R2b, and the like.

Photodetection system 64c includes a polarizer (analyzer), a photodetector, and the like.

In Y encoder 70A, laser beam LB emitted from semiconductor laser LD is incident on polarization beam splitter PBS via lens L1, and is split by polarization into two beams $LB_1$ and $LB_2$. Beam $LB_1$ having been transmitted through polarization beam splitter PBS reaches reflective diffraction grating RG that is formed on Y scale $39Y_1$, via reflection mirror R1a, and beam $LB_2$ reflected off polarization beam splitter PBS reaches reflective diffraction grating RG via reflection mirror R1b. Incidentally, "split by polarization" in this case means the splitting of an incident beam into a P-polarization component and an S-polarization component.

Predetermined-order diffraction beams that are generated from diffraction grating RG due to irradiation of beams $LB_1$ and $LB_2$, for example, the first-order diffraction beams are severally converted into a circular polarized light by λ/4 plates WP1b and WP1a via lenses L2b and L2a, and reflected by reflection mirrors R2b and R2a and then the beams pass through λ/4 plates WP1b and WP1a again and reach polarization beam splitter PBS by tracing the same optical path in the reversed direction.

Each of the polarization directions of the two beams that have reached polarization beam splitter PBS is rotated at an angle of 90 degrees with respect to the original direction. Therefore, the first-order diffraction beam of beam $LB_1$ that was previously transmitted through polarization beam splitter PBS is reflected off polarization beam splitter PBS and is incident on photodetection system 64c, and also the first-order diffraction beam of beam $LB_2$ that was previously reflected off polarization beam splitter PBS is transmitted through polarization beam splitter PBS and is synthesized concentrically with the first-order diffraction beam of beam $LB_1$ and is incident on photodetection system 64c.

Then, the polarization directions of the two first-order diffraction beams described above are uniformly arranged by the analyzer inside photodetection system 64c and the beams interfere with each other to be an interference light, and the interference light is detected by the photodetector and is converted into an electric signal in accordance with the intensity of the interference light.

Figure 3B:
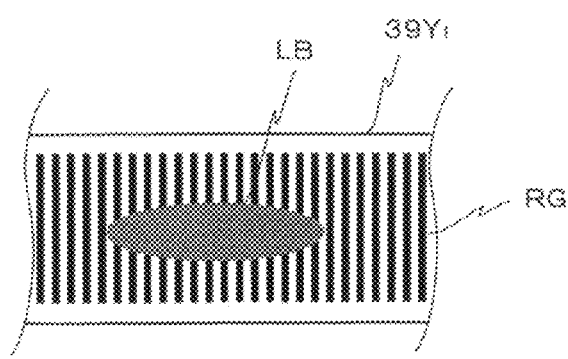
FIG. 3B is a view showing a state where laser beam LB having a sectional shape extending narrowly in the periodic direction of grating RG is used as a detection light.

As is obvious from the above description, in Y encoder 70A, since the optical path lengths of the two beams to be interfered are extremely short and also are almost equal to each other, the influence by air fluctuations can mostly be ignored. Then, when Y scale $39Y_1$ (more specifically, wafer stage WST) moves in a measurement direction (in this case, the Y-axis direction), the phase of the two beams changes, respectively, which changes the intensity of the interference light. This change in the intensity of the interference light is detected by photodetection system 64c, and positional information corresponding to the intensity change is output as a measurement value of Y encoder 70A. The Y encoder configured including head unit 62C and the X encoders and the like each configured including head units 62B and 62D, respectively, are configured in a similar manner as encoder 70A. As each encoder, an encoder having a resolution of, for example, around 0.1 nm is used. Incidentally, with the encoder of the embodiment, as shown in FIG. 3B, laser beam LB serving as a detection beam and having a sectional shape extending narrowly in the periodic direction of grating RG is irradiated from a head on grating RG that faces the head. In FIG. 3B, beam LB is overdrawn largely compared to grating RG.

Referring back to FIG. 1, illumination system 10 includes a light source, an illuminance uniformity optical system, which includes an optical integrator and the like, and an illumination optical system that has a reticle blind and the like (none of which are shown), as is disclosed in, for example, Kokai (Japanese Patent Unexamined Application Publication) No. 2001-313250 (the corresponding U.S. Patent Application Publication No. 2003/0025890) and the like. With illumination system 10, a slit-shaped illumination area which is set on reticle R with a reticle blind is illuminated by illumination light (exposure light) IL with a substantially uniform illuminance. In this case, as illumination light IL, for example, an ArF excimer laser beam (wavelength 193 nm) is used. Further, as the optical integrator, a fly-eye lens, a rod integrator (an internal reflection type integrator), a diffractive optical element or the like can be used.

On reticle stage RST, reticle R on which a circuit pattern or the like is formed on its pattern surface (the lower surface in FIG. 1) is fixed, for example, by vacuum chucking. Reticle stage RST is finely drivable within an XY plane by a reticle stage drive system 111 (not shown in FIG. 1, refer to FIG. 4), and reticle stage RST is also drivable in a predetermined scanning direction (in this case, the Y-axis direction, which is the lateral direction of the page surface in FIG. 1) at a designated scanning speed. Positional information of reticle stage RST is constantly measured by reticle interferometer 116 (not shown in FIG. 1, refer to FIG. 4).

Projection unit PU is held by mainframe 41 via a flange FLG, which is horizontally supported by a plurality of (for example, three) support members 43 via vibration isolation units (not shown) on floor surface F. Projection unit PU includes a barrel 40, and projection optical system PL that has a plurality of optical elements which are held in a predetermined positional relation inside barrel 40. As projection optical system PL, for example, a dioptric system including a plurality of lenses (lens elements) that is disposed along an optical axis AX, which is parallel to the Z-axis direction, is used. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR on reticle R, a reduced image of the circuit pattern (a reduced image of a part of the circuit pattern) of reticle R is formed within illumination area IAR with illumination light IL that has passed through reticle R, in an area (exposure area) IA conjugate to illumination area IAR on wafer W whose surface is coated with a resist (a photosensitive agent), via projection optical system PL (projection unit PU). Incidentally, in the embodiment, while projection unit PU was mounted on mainframe 41, as disclosed in, for example, the pamphlet of International Publication No. 2006/038952, support members 43 can also be extended to the +Z side in FIG. 1 and projection unit PU can be supported in a suspended state at three points with respect to mainframe 41.

Incidentally, in exposure apparatus 100 of the embodiment, since exposure applying the liquid immersion method is performed, in order to prevent an increase in size of the projection optical system and to satisfy the Petzval condition, a catadioptric system configured including mirrors and lenses may also be used as the projection optical system.

Further, in exposure apparatus 100 of the embodiment, in order to perform exposure applying the liquid immersion method, a nozzle unit 32 previously described that constitutes part of a local liquid immersion device 8 is arranged so as to enclose the periphery of the lower end portion of barrel 40 that holds an optical element that is closest to an image plane side (wafer W side) that constitutes projection optical system PL, which is a lens (hereinafter, also referred to a "tip lens") 191 in this case. Nozzle unit 32 is equipped with a supply opening and a recovery opening of liquid Lq, a lower surface to which wafer W is placed facing and at which the recovery opening is arranged, and a supply flow channel and a recovery flow channel that are connected to a liquid supply pipe 31A and a liquid recovery pipe 31B respectively.

In the embodiment, by the liquid being supplied in the space between tip lens 191 and wafer W from liquid supply device 5 (not shown in FIG. 2, refer to FIG. 4) via liquid supply pipe 31A, the supply flow channel, and the supply opening, and the liquid being recovered from the space between tip lens 191 and wafer W by liquid recovery device 6 (not shown in FIG. 2, refer to FIG. 4) via the recovery opening, the recovery flow channel, and liquid recovery pipe 31B, a constant quantity of liquid Lq (refer to FIG. 1) is held in the space between tip lens 191 and wafer W. In this case, liquid Lq held in the space between tip lens 191 and wafer W is constantly replaced.

Incidentally, in the embodiment, as the liquid, pure water (hereinafter, to be simply referred to as "water") that transmits the ArF excimer laser beam (light with a wavelength of 193 nm) is to be used. Refractive index n of the water with respect to the ArF excimer laser beam is around 1.44, and in the water the wavelength of illumination light IL is 193 nm×1/n, shortened to around 134 nm. Incidentally, in FIG. 2, the liquid immersion area formed by water Lq is shown by a reference code 14.

Further, also in the case measurement stage MST is located below projection unit PU, the space between a measurement table (to be described later) and tip lens 191 can be filled with water in the similar manner to the manner described above.

Furthermore, in exposure apparatus 100 of the embodiment, as shown in FIG. 2, a multipoint focal position detecting system (hereinafter, shortly referred to as a "multipoint AF system") by an oblique incident method is arranged, which is composed of an irradiation system 90a and a photodetection system 90b, having a configuration similar to the one disclosed in, for example, Kokai (Japanese Unexamined Patent Application Publication) No. 06-283403 (the corresponding U.S. Pat. No. 5,448,332) and the like. The multipoint AF system has at least a plurality of measurement points placed apart in the X-axis direction in the embodiment.

FIG. 4 shows the main configuration of the control system of exposure apparatus 100. The control system is mainly configured of controller 20 composed of a microcomputer (or workstation) that performs overall control over the entire apparatus.

Next, a measurement operation for restoring the θz rotation of wafer stage WST performed in exposure apparatus 100 of the embodiment will be described.

Figure 5A:
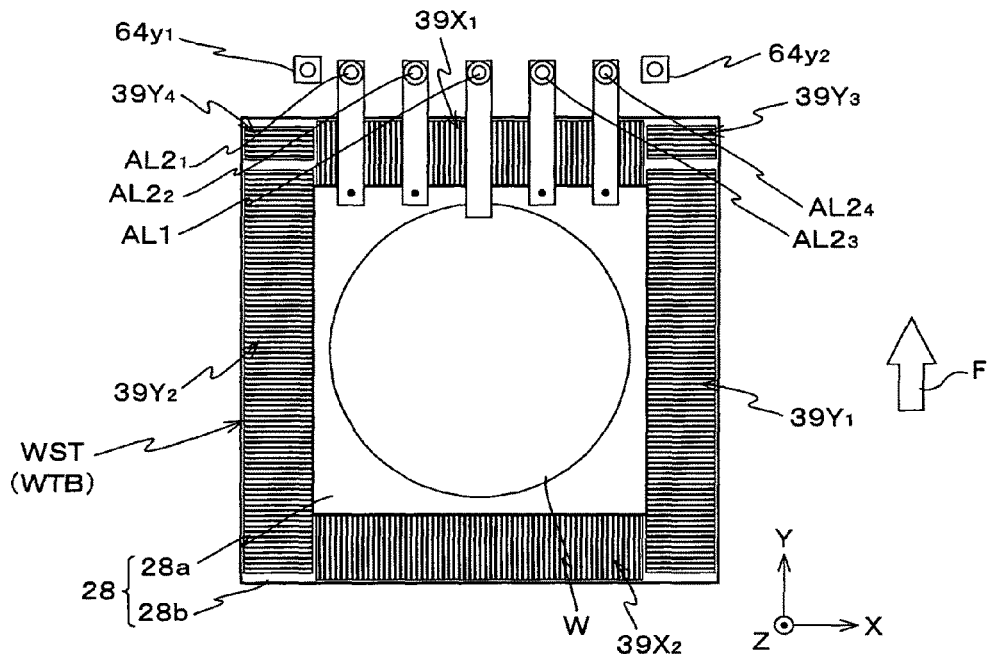
FIG. 5A is a view (No. 1) to explain a measurement operation for restoring the θz rotation of wafer stage WST.

As a premise, reset of each interferometer of interferometer system 118A is to be completed. In response to instructions of an operator, controller 20 drives wafer stage WST based on measurement values of interferometer system 118A, and positions the stage at a position shown in FIG. 5A. In FIG. 5A, for the sake of convenience, components besides alignment systems AL1 and $AL2_1$ to $AL2_4$ and wafer stage WST are omitted (as in FIGS. 5B, 6A, and 6B).

Figure 5B:
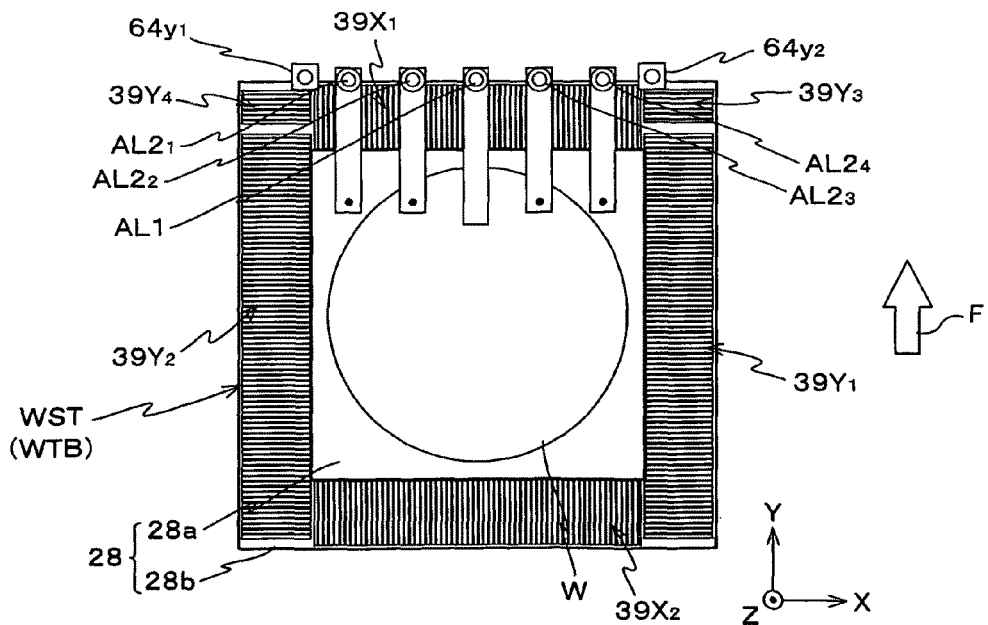
FIG. 5B is a view (No. 2) to explain a measurement operation for restoring the θz rotation of wafer stage WST.
Figure 6A:
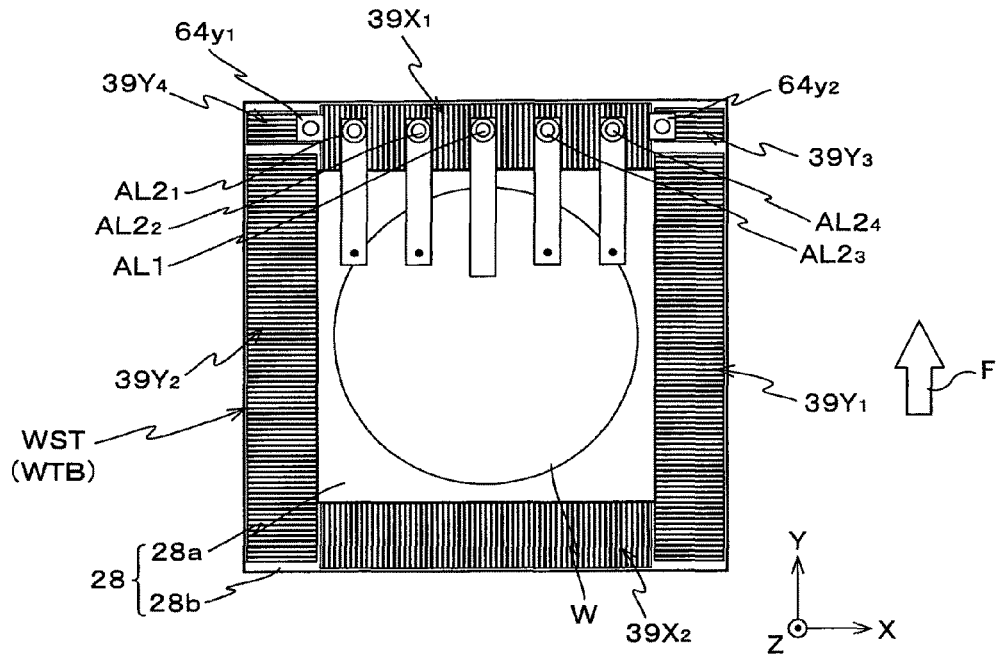
FIG. 6A is a view (No. 3) to explain a measurement operation for restoring the θz rotation of wafer stage WST.
Figure 6B:
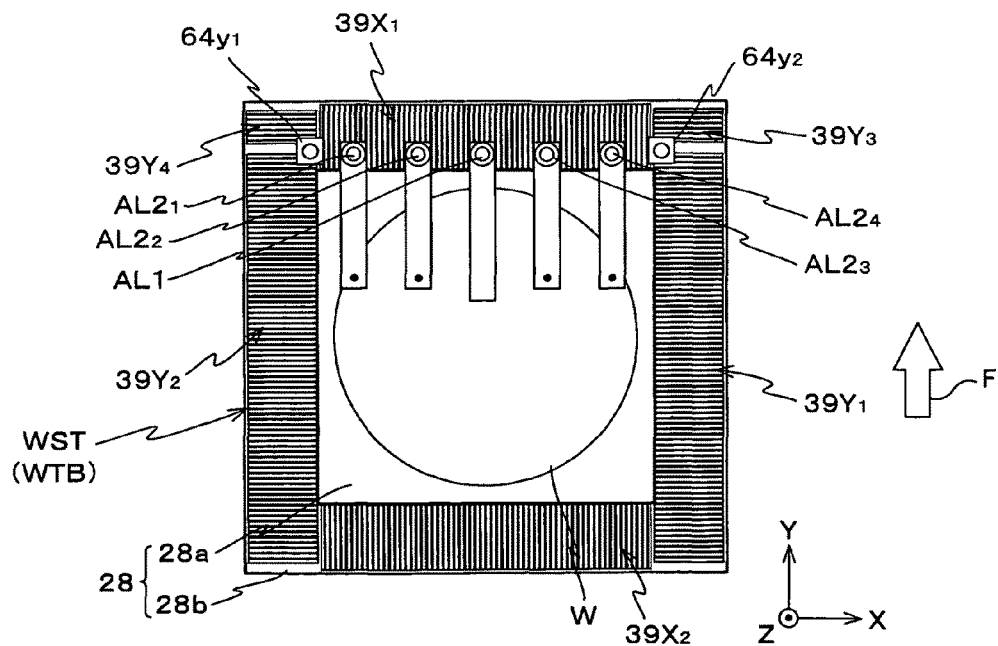
FIG. 6B is a view (No. 4) to explain a measurement operation for restoring the θz rotation of wafer stage WST.

Then, controller 20 drives wafer stage WST in the +Y direction as shown by an arrow F in FIG. 5, based on measurement values of each of the interferometers of interferometer system 118A. On this drive, controller 20 should preferably drive wafer stage WST at a speed level where the short-term fluctuation of measurement values of a Y interferometer of the interferometer system can be ignored. During this drive, Y heads $64y_1$ and $64y_2$ come to face the +Y edges of auxiliary scales $39Y_4$ and $39Y_3$, as shown in FIG. 5B.

Subsequently, controller 20 drives wafer stage WST in the +Y direction at the speed described above. As a result, Y heads $64y_1$ and $64y_2$ cross auxiliary scales $39Y_4$ and $39Y_3$ in the Y-axis direction, from the state shown in FIG. 5B and moving through the state shown in FIGS. 6A and 6B.

Figure 7A:
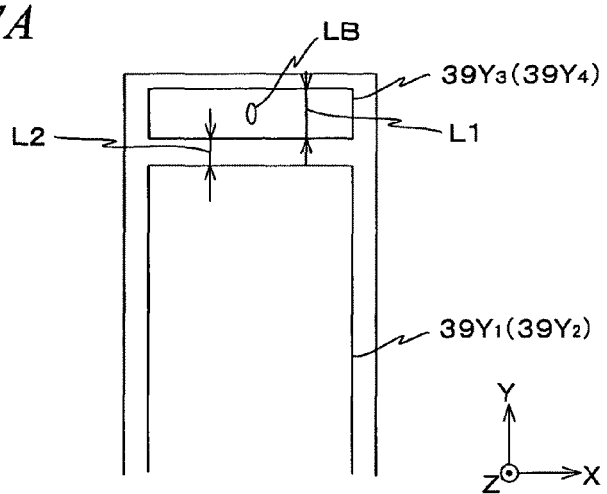
FIG. 7A is a view showing a magnitude relation between the size of laser beam LB emitted from a head, size L1 in the Y-axis direction of auxiliary scales 39Y$_4$ and 39Y$_3$, and size L2 in the Y-axis direction of a clearance area.
Figure 7B:
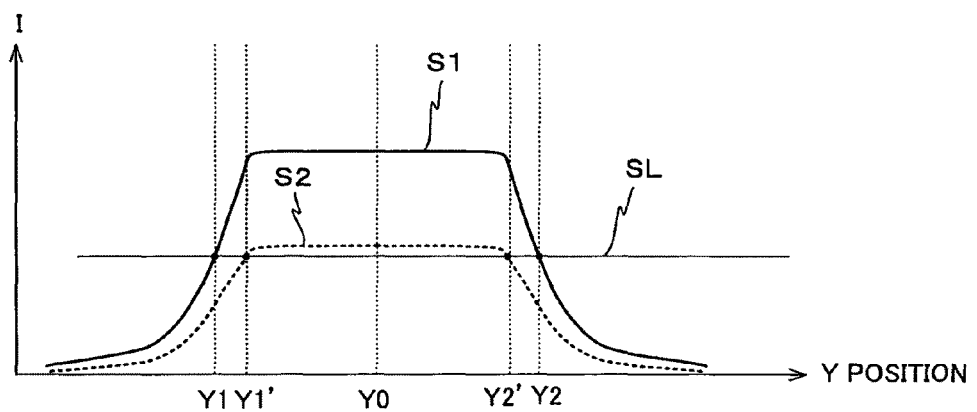
FIG. 7B is a view showing an example of a light intensity signal obtained at the time of a measurement operation for restoring the θz rotation of wafer stage WST.

During the drive of wafer stage WST in the Y-axis direction described above, controller 20 takes in an output signal (a photoelectric conversion signal) of photodetection system 64c (an internal photodetector) of each of the Y heads $64y_1$ and $64y_2$ of the encoder at a predetermined sampling interval. In the embodiment, as shown simplified in FIG. 7A, because the size of laser beam LB in the Y-axis direction emitted from each of the Y heads $64y_1$ and $64y_2$ is smaller than size L1 in the Y-axis direction of auxiliary scales $39Y_4$ and $39Y_3$ and size L2 in the Y-axis direction of the clearance area, and a clearance area (the size in the Y-axis direction equal to or more than half the size of laser beam LB) without any grid lines is also arranged in the space between the edge of the second water repellent plate 28b on the +Y side and auxiliary scales $39Y_4$ and $39Y_3$, a light intensity signal S1 as shown in a curve by a solid line in FIG. 7B can be obtained, for example, from each of the Y heads $64y_1$ and $64y_2$ during the drive described above. In FIG. 7B, the horizontal axis shows the Y position and the vertical axis shows light intensity I.

Figure 8:
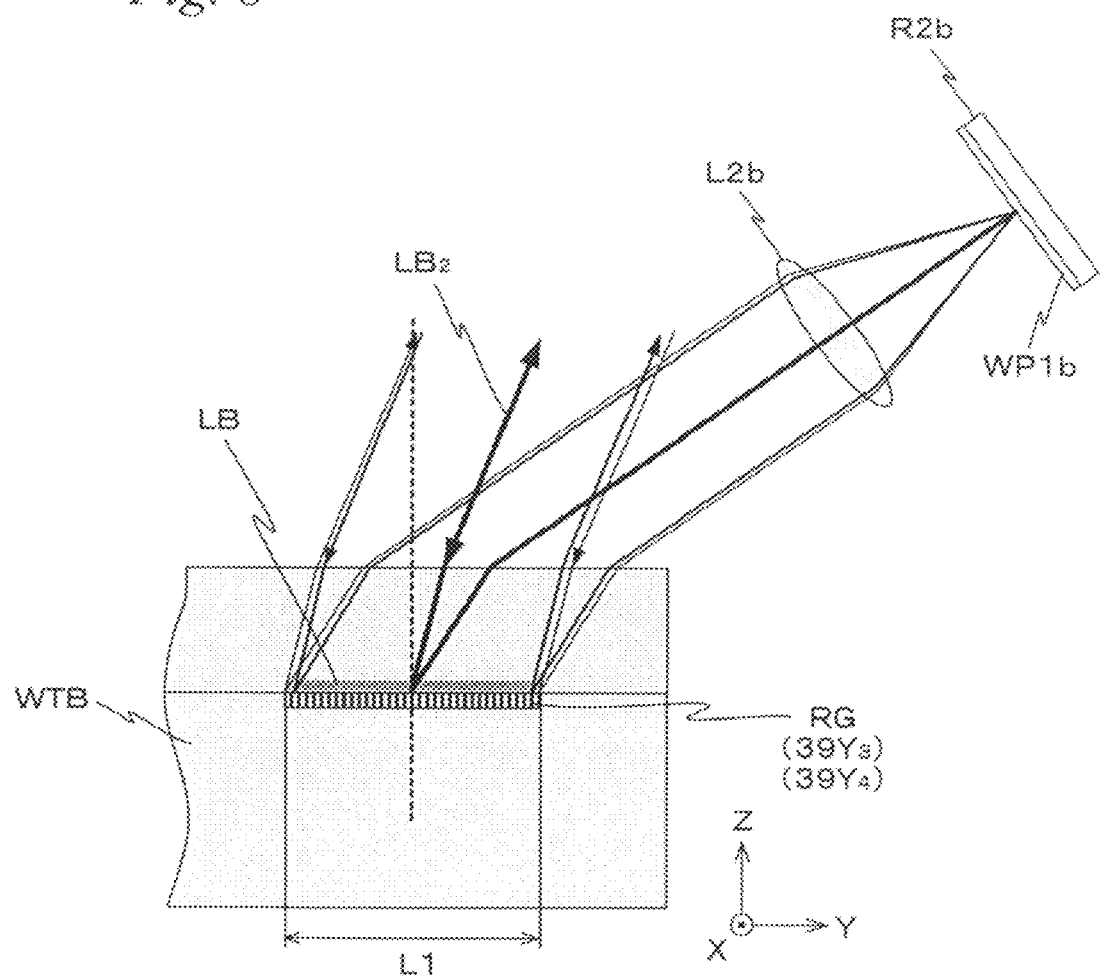
FIG. 8 shows a case where the size of laser beam LB in the Y-axis direction and size L1 of grating RG in the Y-axis direction are substantially coincident.

Next, the principle of obtaining light intensity signal S1 such as the one shown in FIG. 7B will be described, with reference to FIGS. 8 to 10B. In this case, the case will be described where the size of laser beam LB in the Y-axis direction and size L1 of grating RG in the Y-axis direction are substantially consistent as shown in FIG. 8. Incidentally, the optical path and the like of beam LB1 are omitted in FIG. 8.

Figure 9A:
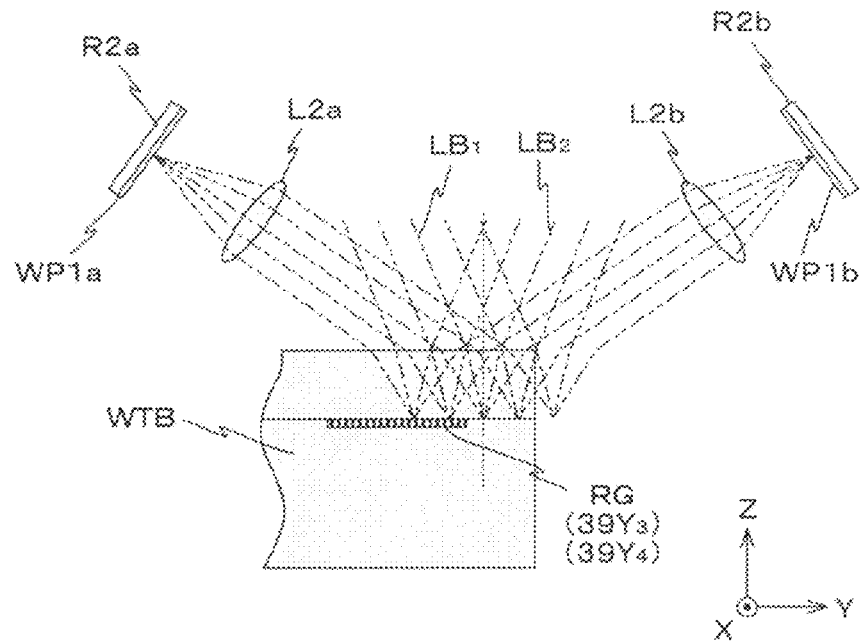
FIG. 9A is a view to explain a principle of obtaining the light intensity signal shown in FIG. 7B, and is a view (No. 1) showing a state where laser beam LB scans the edge of the wafer table.

In the embodiment, as shown for beam $LB_2$ in FIG. 8, a first-order diffraction beam which has been diffracted by grating RG and has passed through lens L2b is reflected by mirror R2b, and returns to grating RG along an optical path in symmetry with the optical axis of lens L2b at the time of incidence, and then returns to polarization beam splitter PBS along the optical path which is parallel to the original optical path. Therefore, as shown in FIG. 9A, even if laser beam LB irradiates grating RG partially, when the irradiated section is less than half the size of laser beam LB, the diffracted light does not return to photodetection system 64c (more specifically, the encoder is not active). Incidentally, in the embodiment, while auxiliary scales are to be used which are configured so that the diffracted light does not return to photodetection system 64c in the case the irradiated section is less than half the size of laser beam LB when laser beam LB partially irradiates grating RG, besides such scales, a clearance area (a section without any gratings) where the output becomes zero can be arranged in each scale, which can be used as an auxiliary scale.

Figure 9B:
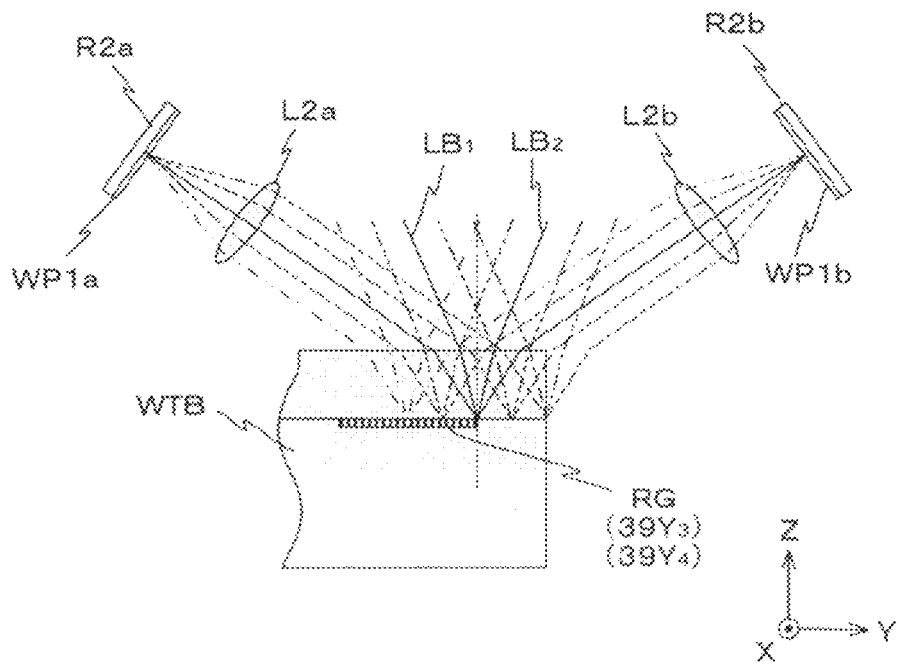
FIG. 9B is a view (No. 2) showing a state where laser beam LB scans the edge of the wafer table.

Meanwhile, when wafer table WTB moves in the +Y-direction from the position in FIG. 9A, and half of laser beam LB irradiates grating RG as shown in FIG. 9B, laser beams $LB_1$ and $LB_2$ become effective simultaneously, and reflected lights of first-order diffraction lights passing through the optical axes of lenses L2a and L2b return to photodetection system 64c.

Figure 10A:
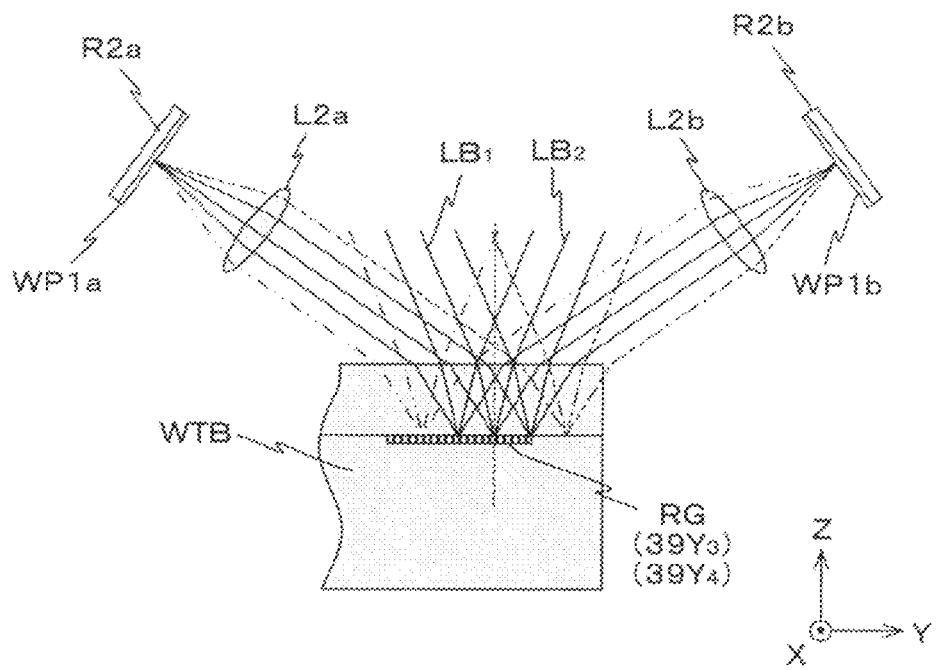
FIG. 10A is a view (No. 3) showing a state where laser beam LB scans the edge of the wafer table.

At the stage in FIG. 10A where wafer table WTB has moved further in the +Y direction from the position shown in FIG. 9B, in addition to the first-order diffraction lights passing through the optical axes of lenses L2a and L2b, reflected lights of first-order diffraction lights of laser beams $LB_1$ and $LB_2$ passing the periphery of the optical axes of lenses L2a and L2b return to photodetection system 64c.

Figure 10B:
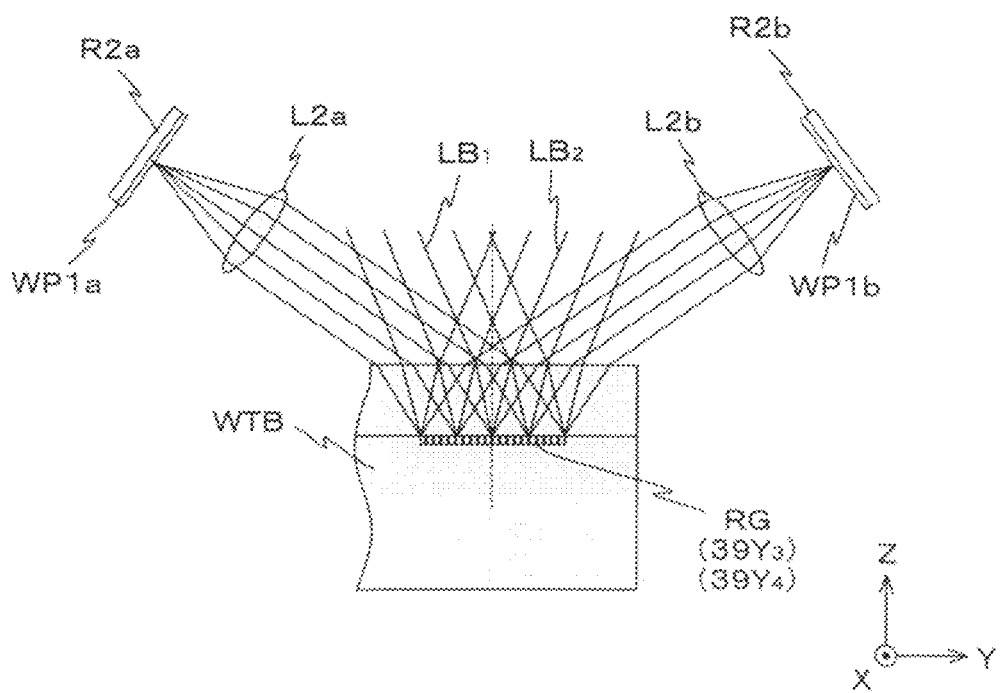
FIG. 10B is a view (No. 4) showing a state where laser beam LB scans the edge of the wafer table.

At the stage in FIG. 10B where wafer table WTB has moved further in the +Y direction from the position shown in FIG. 10A, laser beam LB becomes fully irradiated on grating RG, and the reflected lights (light quantity) of the first-order diffraction lights of laser beams $LB_1$ and $LB_2$ returning to the photodetection system become maximum.

Then, when wafer table WTB moves further in the +Y direction, by reversely moving through states similar to the ones shown in FIGS. 10A and 9B sequentially, the reflected lights of the first-order diffraction lights returning to the photodetection system gradually decreases, and at the point where more than half of laser beam LB moves off of grating RG, the diffracted lights do not return to photodetection system 64c.

As described above, in the case where the size of laser beam LB in the Y-axis direction and size L1 of grating RG in the Y-axis direction are substantially coincident, the light intensity gradually increases with the movement of wafer table WTB, and then gradually decreases after the light intensity reaches the maximum light quantity. However, in the case of embodiment, because the size of laser beam LB in the Y-axis direction emitted respectively from Y heads $64y_1$ and $64y_2$ is smaller than size L1 (and size L2 of the clearance area in the Y-axis direction) of auxiliary scales $39Y_4$ and $39Y_3$ in the Y-axis direction, the state shown in FIG. 10B will continue (a predetermined movement section) for a predetermined period of time. Accordingly, light intensity signal S1 as shown in FIG. 7B can be obtained.

When a signal similar to light intensity signal S1 in FIG. 7B is obtained from each of the Y heads $64y_1$ and $64y_2$ in the manner described above, controller 20 uses each signal to obtain a position coordinate Y0, which is a point in the center of auxiliary scales $39Y_4$ and $39Y_3$ in the Y-axis direction, based on the following formula, serving as positional information of a reference point in each of the auxiliary scales $39Y_4$ and $39Y_3$.

$$Y0=(Y1+Y2)/2 \quad (1)$$

In this case, Y1 and Y2 are Y-coordinates of intersecting points of light intensity signal S1 a predetermined slice level SL, (refer to FIG. 7B). Incidentally, in the case of using (arranging) the section where there are no gratings as previously described as the auxiliary scale, a method of obtaining the center of "the section where there are no gratings" is also preferable.

In this case, when the position coordinate of the point in the center of auxiliary scales $39Y_4$ and $39Y_3$ in the Y-axis direction which are obtained using the light intensity signals of Y heads $64y_1$ and $64y_2$, respectively, are Y01 and Y02, and there is a difference in Y01 and Y02, then, assuming that there are no errors in the formation position of auxiliary scales $39Y_4$ and $39Y_3$ on wafer table WTB, the difference is none other than a setting position error in the Y-axis direction between Y heads $64y_1$ and $64y_2$, whereas, assuming that there are no setting position errors in both Y heads $64y_1$ and $64y_2$, the difference is none other than an error in the formation position of auxiliary scales $39Y_4$ and $39Y_3$ on wafer table WTB. In any case, controller 20 obtains positional information of the reference point in each of the auxiliary scales $39Y_4$ and $39Y_3$, that is, position coordinates Y01 and Y02 described above in the procedure described above in advance, and stores the values in a memory.

Then, after having obtained the position coordinates (Y01' and Y02', respectively)) of the point in the center of auxiliary scales $39Y_4$ and $39Y_3$ in the Y-axis direction at the time of the reset and the like of wafer stage WST using interferometer system 118A in a procedure similar to the one described above, a θz rotational error (yawing amount) Δθz of wafer table WTB is obtained based on formula (2) below, and X and Y interferometers of interferometer system 118A are reset after wafer table WTB has been rotated by θz so that the θz rotational error becomes zero.

$$\Delta\theta z=\{(Y01'-Y01)-(Y02'-Y02)\}/L \quad (2)$$

In this case, L is a design distance between Y heads $64y_1$ and $64y_2$. Incidentally, in the embodiment, distance L shall be consistent with the spacing of the pair of reference gratings on FD bar 46 previously described. Further, distance L can be a measured value rather than the design value.

Now, when obtaining position coordinates Y01 and Y02 described above, when the light quantity (light intensity) level received at the photodetection system of the head of the encoder decreases for some reason, the light intensity signal which is obtained turns out to be like signal S2 shown by a dotted line in FIG. 7B. Even in such a case, in the embodiment, because formula (3) below is valid as long as there are two intersection points in light intensity signal S2 and slice level SL, the decrease hardly affects the embodiment.

$$Y0\approx(Y1'+Y2')/2\approx(Y1+Y2)/2 \quad (3)$$

Figure 7C:
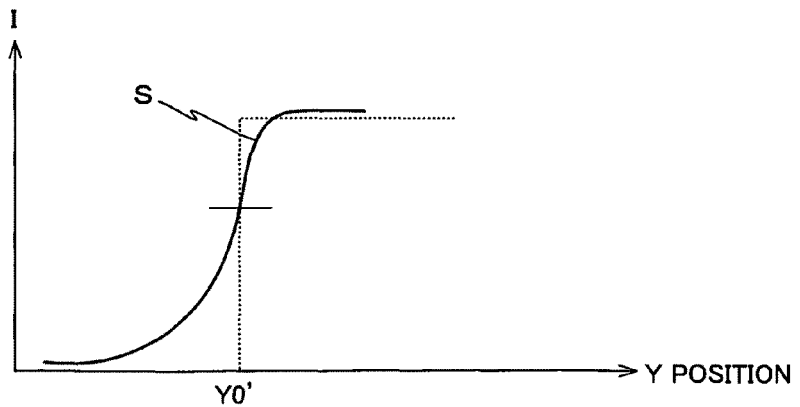
FIG. 7C is a view to explain a measuring method of positional information at the edge of auxiliary scales 39Y$_4$ and 39Y$_3$ on one side in the Y-axis direction.

Incidentally, when the level of light intensity of light intensity signal S is sufficiently large as shown in FIG. 7C, controller 20 can obtain Y-coordinate Y0', which is an intersecting point of slice level SL being obtained by an experiment or a simulation beforehand and signal S, or more specifically, a Y-coordinate of a point on one end (for example, the +Y end) of auxiliary scales $39Y_4$ and $39Y_3$, as the Y positional information at the reference point of auxiliary scales $39Y_4$ and $39Y_3$, respectively. Incidentally, by measuring the pair of reference gratings 52 of FD bar 46 using heads $64y_1$ and $64y_2$ in a procedure similar to the one previously described and obtaining the Y positional information of a point in the center of the pair of reference gratings 52 in the Y-axis direction, the θz rotation can be restored (reset) also for measurement stage MST (measurement stage interferometer system 118B), as in wafer stage WST (interferometer system 118A).

Next, a measurement operation of the positional information of each head of stage encoder 70 with respect to the detection center of primary alignment system AL1 performed in exposure apparatus 100 will be described. In this measurement, a tool wafer $W_M$ as shown in FIGS. 11A and 11B is used.

Figure 11A:
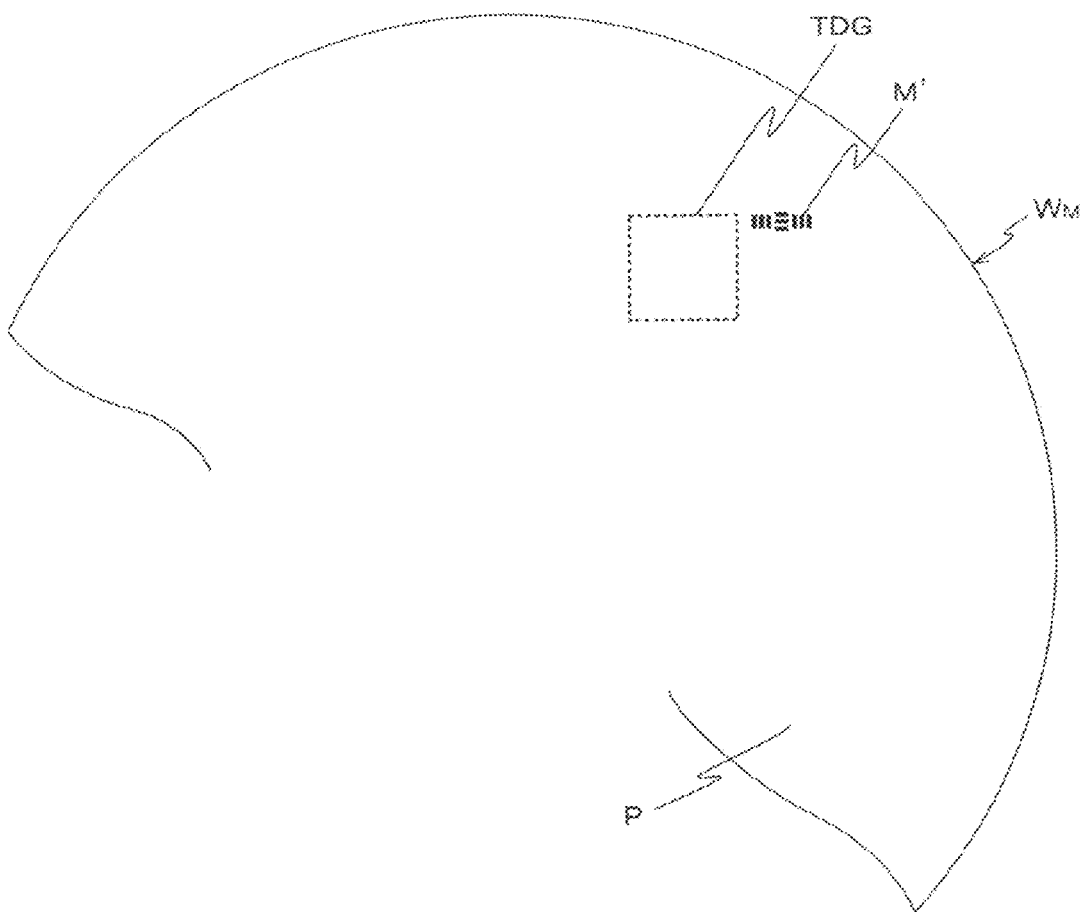
FIG. 11A is a planar view showing a tool wafer.
Figure 11B:
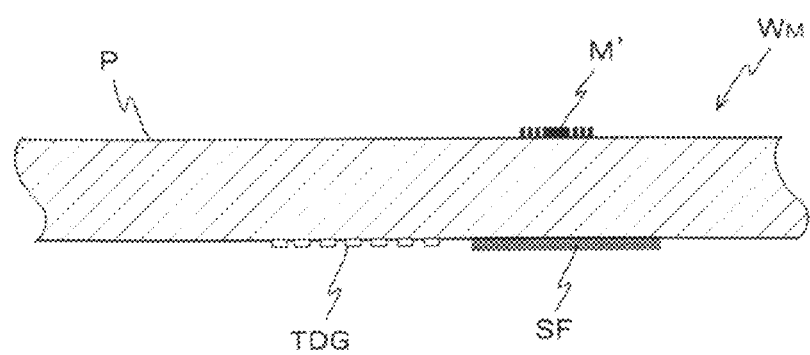
FIG. 11B is a longitudinal sectional view showing the tool wafer.

Tool wafer $W_M$ has a glass wafer P which is about the same thickness as the cover glass previously described that covers the surface of each scale on wafer table WTB, and on the upper surface of glass wafer P, a two-dimensional mark M' is formed as shown in FIG. 11A, which is a planar view, and in FIG. 11B, which is a longitudinal sectional view. Two-dimensional mark M' is a mark that can be measured by primary alignment system AL1, similar to the alignment marks on wafer W. Further, on the back side of glass wafer P (tool wafer $W_M$) that faces two-dimensional mark M', a light-shielding film SF is formed as shown in FIG. 11B. Light-shielding film SF is used when measurement of the two-dimensional mark M' is performed while tool wafer $W_M$ is suctioned on a wafer holder on wafer table WTB, so as to keep unnecessary light from the wafer holder from entering primary alignment system AL1. Accordingly, if generation of the unnecessary return beams from such a wafer holder does not have to be considered, then light-shielding film SF does not necessarily have to be formed.

Further, on the back side of tool wafer $W_M$, a grating that can be measured by each of the heads 64, $64y_1$, and $64y_2$ of stage encoder 70, or head 67, such as, for example, a two-dimensional reflection grating TDG is formed in the vicinity of light-shielding film SF.

The measurement using tool wafer $W_M$ is performed in the following manner. In this case as well, as a premise, reset of each interferometer of interferometer system 118A is to be completed.

First of all, controller 20 loads tool wafer $W_M$ on the wafer holder on wafer table WTB via a wafer carrier system (not shown), and tool wafer $W_M$ is held by suction by the wafer holder. At this point, tool wafer $W_M$ is loaded on the wafer holder in a state where rotational error is corrected, similar to wafer W used to manufacture devices.

Next, controller 20 drives wafer stage WST within an XY plane based on measurement values of each of the interferometers of interferometer system 118A so that two-dimensional mark M' on the upper surface of tool wafer $W_M$ is located within a detection field of primary alignment system AL1. Then, controller 20 measures positional information (positional information with respect to the detection center) of two-dimensional mark M' using primary alignment system AL1, and based on the measurement results, measurement values of interferometer system 118A at the time of the measurement, and the positional information that has been measured, a position coordinate (x, y) of the detection center of the primary alignment system is computed, and stored in memory.

Next, controller 20 drives wafer stage WST within the XY plane based on the measurement values of each of the interferometers of interferometer system 118A so that grating TDG of tool wafer $W_M$ crosses the area under an arbitrary head (hereinafter referred to as an object head) of stage encoder 70 in Y-axis direction, and measures the Y-coordinate of a point in the center of grating TDG in a procedure similar to the one previously described using the object head. Then, controller 20 drives wafer stage WST within the XY plane based on the measurement values of each of the interferometers of interferometer system 118A so that grating TDG of tool wafer $W_M$ crosses the area under the object head in X-axis direction, and measures the X-coordinate of a point in the center of grating TDG in a procedure similar to the one previously described using the object head. And then, controller 20 stores position coordinate (X, Y) of grating TDG described above in memory as a position coordinate (X, Y) of the object head.

In this case, in the embodiment, as previously described, because position coordinate (X, Y) of the object head is obtained using the light intensity signal like the ones shown in FIG. 7B when the head crosses the grating, the X-coordinate can be measured also for Y head 64, and the Y-coordinate can also be measured similarly for X head 67.

Controller 20 measures the position coordinates of the remaining heads of stage encoder 70 similarly in the manner described above, and the results are stored in memory.

Then, controller 20 computes the positional relation between the detection center of primary alignment system AL1 and all of the heads of stage encoder 70, based on a known positional relation between mark M' and grating TDG, the position coordinate of each of the heads which are measured, and the position coordinate of the detection center of primary alignment system AL1, and stores the results in memory.

Next, a baseline measurement operation of secondary alignment system $AL2_n$ (n=1-4), which is mainly performed just before starting the processing to the wafer of each lot (the beginning of a lot) will be described. In this case, the baseline of secondary alignment system $AL2_n$ refers to a relative position of (the detection center of) each secondary alignment system $AL2_n$, with (the detection center of) primary alignment system AL1 serving as a reference. Incidentally, measurement (a baseline check) of the baseline (positional relation (or the distance) between a projection position of a pattern (for example, the pattern of reticle R) by projection optical system PL and the detection center of primary alignment system AL1) of primary alignment system AL1 is to be performed already. Further, the position in the X-axis direction of secondary alignment system $AL2_n$ (n=1-4) is to be set, for example, by rotational drive mechanism $60_n$ previously described driving the system in accordance with the shot map data of the wafer within the lot.

Figure 12A:
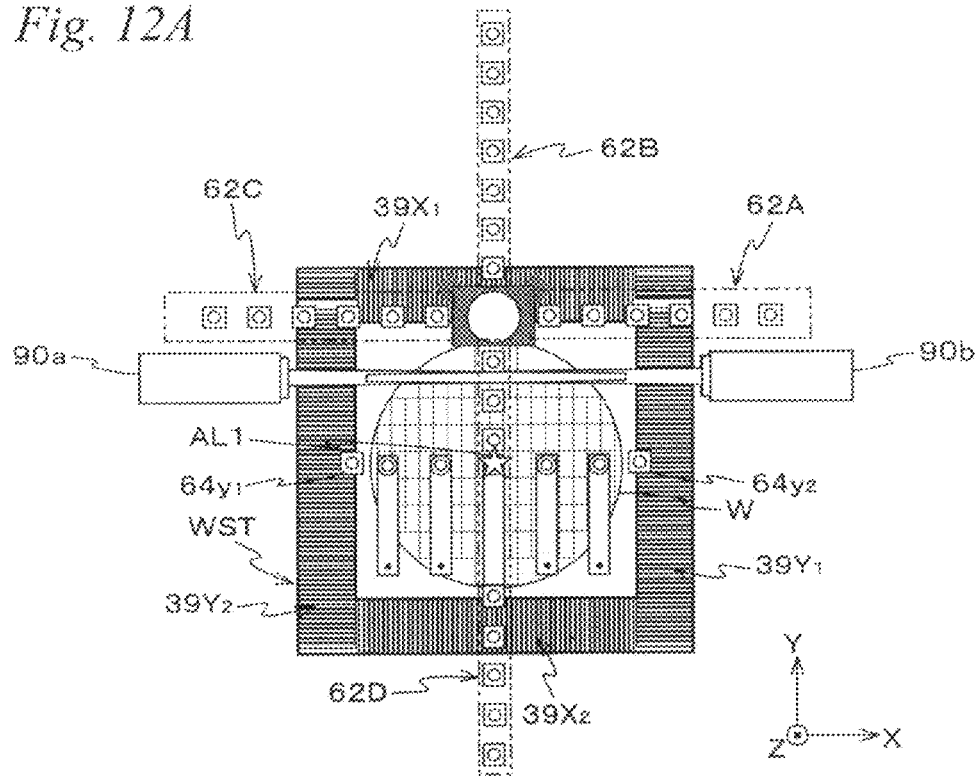
FIGS. 12A and 12B are views to explain a baseline measurement operation of secondary alignment systems performed to a wafer at the head of a lot.
Figure 12B:
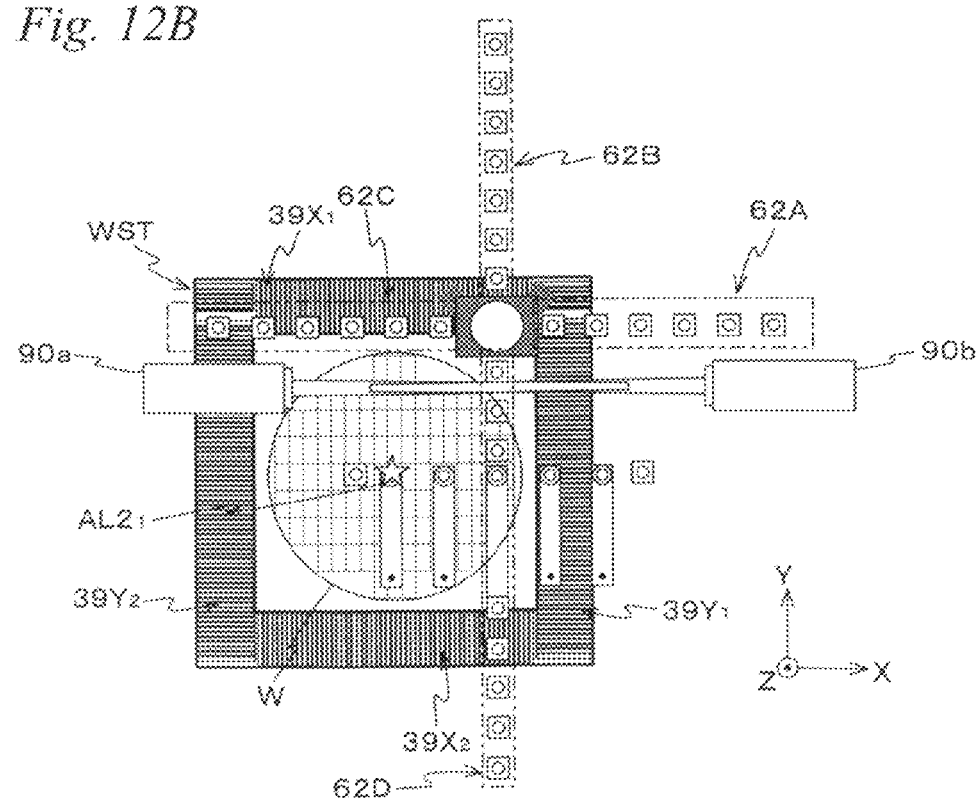

On the baseline measurement of the secondary alignment system performed to the wafer at the head of a lot (hereinafter, also referred to as "Sec-BCHK" as needed), first of all, as is shown in FIG. 12A, controller 20 detects a specific alignment mark on wafer W (process wafer) at the head of a lot with primary alignment system AL1 (refer to a star-shaped mark in FIG. 12A), and then, controller 20 makes the detection results correspond to the measurement values of stage encoder 70 at the time of the detection, and stores them in memory. Next, controller 20 moves wafer stage WST in the −X direction by a predetermined distance, and as is shown in FIG. 12B, detects the specific alignment mark with secondary alignment system $AL2_1$ (refer to a star-shaped mark in FIG. 12B), and makes the detection results correspond to the measurement values of the stage encoder described above at the time of the detection, and stores them in memory.

Similarly, controller 20 moves wafer stage WST in the +X direction and sequentially detects the specific alignment mark with the remaining secondary alignment systems $AL2_2$, $AL2_3$ and $AL2_4$, and then sequentially makes the detection results correspond to the measurement values of the stage encoder at the time of the detection and stores them in memory, and based on the processing results, controller 20 computes the baseline of each secondary alignment system $AL2_n$.

In this manner, because the baseline of each secondary alignment system $AL2_n$ is obtained by detecting the same alignment mark on wafer W with primary alignment system AL1 and each secondary alignment system $AL2_n$ using wafer W (process wafer) at the beginning of a lot, by this measurement, the difference in detection offset among the alignment systems caused by the process can be consequently corrected. Incidentally, baseline measurement of secondary alignment system $AL2_n$ can also be performed using a reference mark on wafer stage WST or measurement stage MST, instead of the alignment mark on the wafer. Further, in the embodiment, because primary alignment system AL1 and secondary alignment system $AL2_n$ can each detect a two-dimensional mark (X, Y), by using the two-dimensional mark at the time of baseline measurement of secondary alignment system $AL2_n$, the baseline of secondary alignment system $AL2_n$ in the X-axis and the Y-axis directions can be obtained simultaneously.

Next, a Sec-BCHK operation, which is performed at predetermined timing during the processing of wafers in a lot, for example, a period from when exposure of a wafer ends until when the loading of the next wafer on wafer table WTB is completed (that is, during wafer replacement) will be described. In this case, because the Sec-BCHK is performed at intervals of each wafer replacement, hereinafter the Sec-BCHK is also referred to as the Sec-BCHK (interval).

Figure 13:
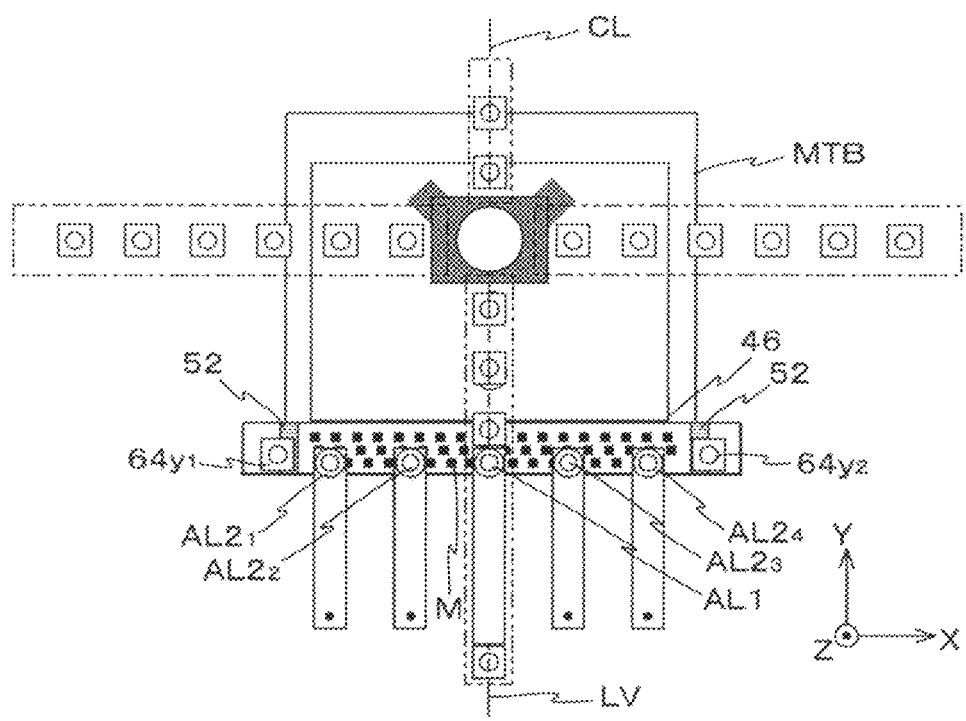
FIG. 13 is a view used to explain a baseline check operation of the secondary alignment systems performed at every wafer exchange.

On this Sec-BCHK (interval), as is shown in FIG. 13, controller 20 moves measurement stage MST so that straight line LV on which the detection center of primary alignment system AL1 is placed substantially coincides with centerline CL and also FD bar 46 faces primary alignment system AL1 and secondary alignment system $AL2_n$. Then, controller 20 adjusts the θz rotation of FD bar 46 based on the measurement values of the pair of reference gratings 52 on FD bar 46 and Y heads $64y_1$ and $64y_2$ that face the pair of reference gratings 52, respectively, and also adjusts the XY-position of FD bar 46, for example, using the measurement values of the interferometers, based on the measurement values of primary alignment system AL1 that detects reference mark M located on or in the vicinity of centerline CL of measurement table MTB.

Then, in this state, controller 20 obtains each of the baselines of the four secondary alignment systems $AL2_1$ to $AL2_4$, by simultaneously measuring reference mark M on FD bar 46 that is located within the field of each of the secondary alignment systems using the four secondary alignment systems $AL2_1$ to $AL2_4$. Then, on the subsequent processing, drift of the baselines of four secondary alignment systems $AL2_1$ to $AL2_4$ is corrected by using the newly measured baselines.

Incidentally, the Sec-BCHK (interval) described above is to be performed by simultaneous measurement of different reference marks by a plurality of secondary alignment systems, however, the present invention is not limited to this, and each of the baselines of four secondary alignment systems $AL2_1$ to $AL2_4$ may also be obtained by sequentially (non-simultaneously) measuring the same reference mark M on FD bar 46 with a plurality of secondary alignment systems.

As a result of obtaining the baselines of secondary alignment systems $AL2_1$ to $AL2_4$ in the manner described above, positional relation between each of the secondary alignment systems $AL2_1$ to $AL2_4$ and each of the heads of the stage encoder is obtained, based on the baselines and the positional relation between the detection center of the primary alignment system and all of the heads of stage encoder 70 that has been measured earlier and is stored in memory. Accordingly, by controlling the position of the wafer stage at the time of exposure using the stage encoder based on the results of wafer alignment which will be described later on, it becomes possible to align each shot area on wafer W to the projection position of the reticle pattern with good precision.

In exposure apparatus 100 of the embodiment, a parallel processing operation that uses wafer stage WST and measurement stage MST is performed. During the parallel processing operation, the position of wafer stage WST within the XY plane is measured mainly using stage encoder 70, and in the range where stage encoder 70 cannot be used, the position is measured using interferometer system 118A. Further, the position of measurement stage MST is measured using measurement stage interferometer system 118B. And, in exposure apparatus 100, liquid immersion area 14 is formed using local liquid immersion device 8 on wafer W mounted on wafer stage WST, and exposure operation of wafer W is performed with illumination light IL, via projection optical system PL and liquid Lq of liquid immersion area 14. Controller 20 performs the exposure operation, based on results of wafer alignment (EGA) that has been performed beforehand by alignment systems AL1, and $AL2_1$ to $AL2_4$ and on the latest baseline and the like of alignment systems AL1, and $AL2_1$ to $AL2_4$, by repeating a movement operation between shots in which wafer stage WST is moved to a scanning starting position (an acceleration starting position) for exposure of each shot area on wafer W, and a scanning exposure operation in which a pattern formed on reticle R is transferred onto each shot area by a scanning exposure method. Subsequently, controller 20 performs the Sec-BCHK (interval) in which relative positions of the four secondary alignment systems with respect to primary alignment system AL1 are measured, using FD bar 46 supported by measurement stage MST, while loading (or exchange) of the wafer on wafer stage WST is being performed.

Furthermore, when wafer stage WST which has completed wafer loading (or exchange) moves directly under alignment systems AL1, $AL2_1$ and $AL2_4$, controller 20 performs an alignment operation in the manner described below.

Figure 14A:
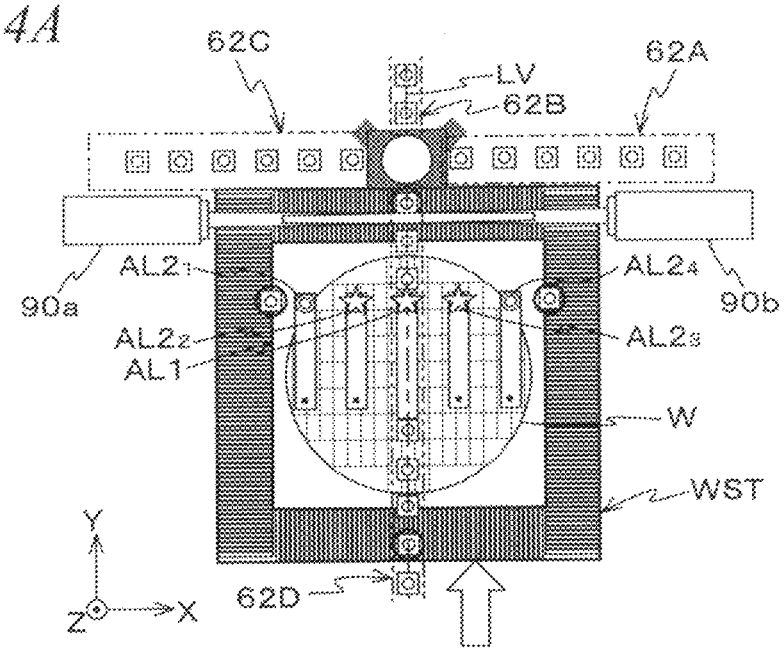
FIGS. 14A to 14C are views used to explain wafer alignment performed in the exposure apparatus related to the first embodiment.
Figure 14B:
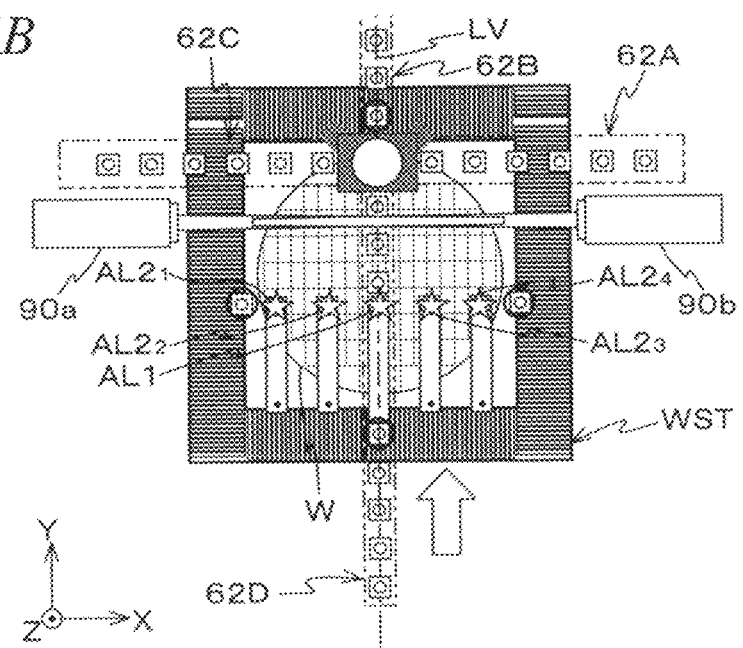
Figure 14C:
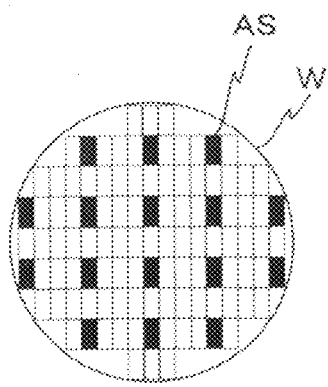

Incidentally, in the alignment operation of the embodiment, 16 shot areas AS, which are colored on wafer W on which a plurality of shot areas is formed in a layout (shot map) shown in FIG. 14C, serve as alignment shot areas. In FIGS. 14A and 14B, the illustration of measurement stage MST is omitted.

As a premise, position adjustment (position adjustment using rotational drive mechanism $60_n$) in the X-axis direction of secondary alignment systems $AL2_1$ to $AL2_4$ is to be performed beforehand, in accordance with the placement of alignment shot areas AS.

First of all, controller 20 moves wafer stages WST positioned at a loading position (not shown) (the lower right hand side in FIG. 14A), slightly lower (a predetermined position (alignment starting position to be described later) where the center of wafer W is located on straight line LV) than the position shown in FIG. 14A. This movement is performed based on positional information of wafer stage WST which is measured using stage encoder 70 and interferometer system 118A.

Next, controller 20 moves wafer stage WST in the +Y direction by a predetermined distance based on the measurement values of stage encoder 70, and sets the position of wafer stage WST at a position shown in FIG. 14A, and almost simultaneously and individually detects the alignment marks arranged in three first alignment shot areas AS (refer to the star-shaped marks in FIG. 14A) using primary alignment system AL1 and secondary alignment systems $AL2_2$ and $AL2_3$, and then links the detection results of the three alignment systems AL1, and $AL2_2$ and $AL2_3$ above and the measurement values of stage encoder 70 at the time of the detection and stores them in memory (not shown). Incidentally, secondary alignment systems $AL2_1$ and $AL2_4$ at both ends which are not detecting any alignment marks can be made not to irradiate, or to irradiate detection beams on wafer table WTB (or the wafer). Further, in the wafer alignment in the embodiment, the position of wafer stage WST in the X-axis direction is set so that primary alignment system AL1 is placed on the centerline of wafer table WTB, and primary alignment system AL1 detects the alignment mark in the alignment shot area that is located on a meridian of wafer W.

Next, main controller 20 moves wafer stage WST in the +Y direction by a predetermined distance based on the measurement values of stage encoder 70, and sets the position of wafer stage WST at a position at which five alignment systems AL1 and $AL2_1$ to $AL2_4$ can almost simultaneously and individually detect the alignment marks arranged in the five second alignment shot areas AS on wafer W, and almost simultaneously and individually detects the five alignment marks using five alignment systems AL1 and $AL2_1$ to $AL2_4$, and then links the detection results of five alignment systems AL1 and $AL2_1$ to $AL2_4$ and the measurement values of stage encoder 70 at the time of the detection and stores them in memory (not shown).

Next, controller 20 moves wafer stage WST in the +Y direction by a predetermined distance based on the measurement values of stage encoder 70, and sets the position of wafer stage WST at a position at which five alignment systems AL1 and $AL2_1$ to $AL2_4$ can almost simultaneously and individually detect the alignment marks arranged in the five third alignment shot areas AS on wafer W, and almost simultaneously and individually detects the five alignment marks (refer to star-shaped marks in FIG. 14B) using five alignment systems AL1 and $AL2_1$ to $AL2_4$, and then links the detection results of five alignment systems AL1 and $AL2_1$ to $AL2_4$ and the measurement values of stage encoder 70 at the time of the detection and stores them in memory (not shown).

Next, controller 20 moves wafer stage WST in the +Y direction by a predetermined distance based on the measurement values of stage encoder 70, and sets the position of wafer stage WST at a position at which the alignment marks arranged in the three fourth alignment shot areas AS on wafer W can be almost simultaneously and individually detected using primary alignment system AL1 and secondary alignment systems $AL2_2$ and $AL2_3$, and almost simultaneously and individually detects the three alignment marks using three alignment systems AL1, $AL2_2$ and $AL2_3$, and then links the detection results of three alignment systems AL1, $AL2_2$ and $AL2_3$ and the measurement values of stage encoder 70 at the time of the detection and stores them in memory (not shown).

Then, controller 20 computes an array (coordinate values) of all the shot areas on wafer W on a coordinate system (for example, an XY coordinate system using the optical axis of projection optical system PL as its origin) that is set by the measurement axes of stage encoder 70 (four head units), by performing a statistical computation by the EGA method, which is disclosed in, for example, Kokai (Japanese Unexamined Patent Application Publication) No. 61-044429 (the corresponding U.S. Pat. No. 4,780,617) and the like, using the detection results of a total of 16 alignment marks and the corresponding measurement values of stage encoder 70 obtained in the manner described above, and the baseline of secondary alignment system $AL2_n$.

As is described above, in the embodiment, by moving wafer stage WST in the +Y direction and setting the position of wafer stage WST at four points on the moving route, position information of alignment marks in the alignment shot areas AS at 16 points in total can be obtained in a remarkably shorter period of time, compared with the case where a single alignment system sequentially detects alignment marks at 16 points. In this case, for example, as it is easier to understand in particular when considering alignment systems $AL1$, $AL2_2$ and $AL2_3$, each of alignment systems $AL1$, $AL2_2$ and $AL2_3$ detects a plurality of alignment marks arrayed along the Y-axis direction that are sequentially placed within the detection area, associated with the operation of moving wafer stage WST described above. Therefore, on position measurement of the alignment marks described above, it is not necessary to move wafer stage WST in the X-axis direction.

Further, in this case, because the number of detection points (the number of measurement points) of alignment marks on wafer W that are almost simultaneously detected by a plurality of alignment systems differs depending on the position within the XY plane of wafer stage WST (the Y-position in particular (i.e. the access degree of wafer W to a plurality of alignment systems), when moving wafer stage WST in the Y-axis direction that is orthogonal to the array direction (X-axis direction) of a plurality of alignment systems, the marks at positions different from one another on wafer W can be detected in accordance with the position of wafer stage WST in the Y-axis direction, or in other words, can be detected simultaneously using the required number of alignment systems, in accordance with the shot array on wafer W.

Incidentally, in the embodiment, while wafer stage WST moves in the alignment described above, multipoint AF system consisting of irradiation system 90a and photodetection system 90b is used to obtain the Z position of the entire surface of wafer W.

Then, controller 20 performs liquid immersion exposure by the step-and-scan method based on the measurement results of wafer alignment (EGA) and the baseline of the primary alignment system measured beforehand and the like previously described, and sequentially transfers a reticle pattern onto a plurality of shot areas on wafer W. Afterwards, similar operations are repeatedly performed to the remaining wafers within the lot. Incidentally, the control in the Z-axis direction of wafer stage WST during exposure is performed using other measurement devices previously described that perform position control of wafer stage WST in the Z-axis, the θx, and the θy directions, based on the Z position of the entire surface of wafer W obtained during the alignment using the multipoint AF system.

As described above, according to the embodiment, Y scales $39Y_1$ and $39Y_2$ are placed on both ends in the X-axis direction on the upper surface of wafer table WTB (wafer stage WST), and on the +Y side of each of the Y scales $39Y_1$ and $39Y_2$, or more specifically, in the vicinity of the edge on the +Y side of wafer table WTB, auxiliary scales $39Y_3$ and $39Y_4$ are placed whose periodic direction of the grating is the Y-axis direction and the size in the periodic direction is smaller when compared with Y scales $39Y_1$ and $39Y_2$. Therefore, as previously described, wafer stage WST is driven in the +Y direction so that the two Y heads $64y_2$ and $64y_1$ of the stage encoder cross auxiliary scales $39Y_3$ and $39Y_4$ based on the measurement values of interferometer system 118A, and based on the Y-coordinate of two intersecting points with photoelectric conversion signals (light intensity signals) of Y heads $64y_2$ and $64y_1$ obtained during the drive and slice level SL, the Y-coordinate of the midpoint in the Y-axis direction of auxiliary scales $39Y_3$ and $39Y_4$ is obtained as Y positional information at the reference points of wafer table WTB at both ends in the X-axis direction. By performing the detection of the Y positional information of the reference points of wafer table WTB at a predetermined timing, restoration of the θz rotation at the time of the reset of the wafer stage (interferometer system) can be performed with good reproduction using the Y positional information of the reference points as previously described, until the next detection of Y positional information of the reference points is performed.

Further, by performing a measurement similar to the measurement of the Y positional information at the reference points of wafer table WTB at both ends in the X-axis direction for each head of stage encoder 70, it becomes possible to precisely obtain the positional information of each head.

Then, after having performed the measurement (a kind of calibration process) described above, it becomes possible to perform position control of wafer stage WST with good precision using stage encoder 70.

Further, in exposure apparatus 100 related to the embodiment, as previously described, positional information of the stage encoder can be measured with good precision even if tool wafer $W_M$ is used. In this case, positional relation between the detection center of primary alignment system AL1 and each head can be obtained with good precision, and positional relation between the heads can also be obtained.

Further, when each measurement is performed prior to the beginning of exposure, it becomes possible to control the position of wafer stage WST with good precision on exposure using stage encoder 70 of position measurement system 200 taking into consideration the measurement results for pattern formation on a wafer, and this allows a pattern to be formed on the wafer with good precision.

Incidentally, in the embodiment above, the case has been described where Y scales $39Y_1$ and $39Y_2$ are placed on both ends in the X-axis direction on the upper surface of wafer table WTB (wafer stage WST), and on the +Y side of each of the Y scales $39Y_1$ and $39Y_2$, or more specifically, in the vicinity of the edge on the +Y side of wafer table WTB, auxiliary scales $39Y_3$ and $39Y_4$ are placed whose periodic direction of the grating is the Y-axis direction and the size in the periodic direction is smaller when compared with Y scales $39Y_1$ and $39Y_2$, however, the present invention is not limited to this. For example, only one of auxiliary scales $39Y_3$ and $39Y_4$ may be arranged on wafer table WTB. Even in such a case, for example, measurement of the positional information of each of the heads of stage encoder 70 is possible in a procedure like the procedure previously described.

Or, a calibration area used for some kind of calibration of a measurement device that measures positional information of an encoder head or other positional information of wafer stage WST can be formed in the area where auxiliary scales $39Y_3$ and $39Y_4$ are formed, with a pattern other than the grating formed or with no patterns arranged at all. In such a case, it becomes possible to perform a predetermined calibration process using the calibration area, while moving wafer stage WST.

Incidentally, in the embodiment above, while the case has been described where aligner 99 is equipped with four secondary alignment systems, the number of the secondary alignment systems can be arbitrary. Further, the number of primary alignment system AL1 is not limited to one and a plurality of systems can be used, and a configuration drivable within the XY plane similar to the secondary alignment system can be employed.

Incidentally, each of the alignment systems described above is not limited to the FIA system, and an alignment sensor, which irradiates a coherent detection light to a subject mark and detects a scattered light or a diffracted light generated from the subject mark or makes two diffracted lights (for example, diffracted lights of the same order or diffracted lights being diffracted in the same direction) generated from the subject mark interfere and detects an interference light, can naturally be used alone or in combination as needed.

Incidentally, in the embodiment above, while a nozzle unit that has a lower surface where the wafer faces was used, a configuration having multiple nozzles as disclosed in, for example, the pamphlet of International Publication No. 99/49504 can also be employed. The point is that any configuration can be employed, as long as the liquid can be supplied in the space between optical member (tip lens) 191 in the lowest end constituting projection optical system PL and wafer W. For example, the liquid immersion mechanism disclosed in the pamphlet of International Publication No. 2004/053955, and the liquid immersion mechanism disclosed in the EP Patent Publication No. 1420298 can also be applied to the exposure apparatus of the embodiment.

Incidentally, in the embodiment above, the case has been described where Sec-BCHK (interval) is performed using FD bar 46 on the measurement stage MST side while each wafer is exchanged on the wafer stage WST side, however, the present invention is not limited to this, and at least one of an illuminance unevenness measurement (and illuminance measurement), aerial image measurement, wavefront aberration measurement and the like can be performed using a group of measuring instruments of measurement stage MST, and the measurement results can be reflected in the exposure of the wafer performed later on. To be more concrete, for example, projection optical system PL can be adjusted based on the measurement results. Further, the liquid immersion area can be held on measurement stage MST during the wafer exchange, and when wafer stage WST is placed directly under projection unit PU on exchange with the measurement stage, the liquid immersion area on the measurement stage can be moved onto the wafer stage.

Incidentally, in the embodiment, while the case has been described where wafer stage WST includes stage main section 91 and wafer table WTB, a single stage that can move in six degrees of freedom can also be employed as wafer stage WST. Incidentally, instead of a reflection surface, a movable mirror consisting of a plane mirror can be arranged in wafer table WTB. Further, as a configuration of the measurement stage, the present invention is not limited to the one described in the embodiment above, and for example, measurement stage MST can employ the so-called coarse and fine movement structure in which measurement table MTB can be finely driven in the X-axis direction, the Y-axis direction, and the θz direction with respect to stage main section 92, or measurement table MTB can be fixed to stage main section 92, and stage main section 92 including measurement table MTB and can be configured drivable in directions of six degrees of freedom.

Incidentally, in the embodiment above, pure water (water) was used as the liquid, however, it is a matter of course that the present invention is not limited to this. As the liquid, a chemically stable liquid that has high transmittance to illumination light IL and is safe to use, such as a fluorine-containing inert liquid can be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane or the like can be cited. Alternatively, a liquid obtained by mixing arbitrary two or more of these liquids may be used, or a liquid obtained by adding (mixing) the predetermined liquid to (with) pure water can be used. Alternatively, as the liquid, a liquid obtained by adding (mixing) base or acid such as H+, Cs+, K+, Cl—, $SO_4^{2-}$, or $PO_4^{2-}$ to (with) pure water can be used. Moreover, a liquid obtained by adding (mixing) particles of Al oxide or the like to (with) pure water can be used. These liquids can transmit ArF excimer laser beam. Further, as the liquid, liquid, which has a small absorption coefficient of light, is less temperature-dependent, and is stable to a projection optical system (tip optical member) and/or a photosensitive agent (or a protection film (top coat film), an antireflection film, or the like) coated on the surface of a wafer, is preferable. Further, in the case an $F_2$ laser is used as the light source, fomblin oil can be selected.

Further, in the embodiment above, the recovered liquid may be reused, and in this case, a filter that removes impurities from the recovered liquid is preferably arranged in a liquid recovery device, a recovery pipe or the like. Furthermore, in the embodiment above, while the exposure apparatus was equipped with all of local liquid immersion device 8, the exposure apparatus does not have to be equipped with a part of (for example, liquid supply device and/or liquid recovery device and the like) local liquid immersion device 8, and these parts can be substituted by the equipment available in the factory where the exposure apparatus is installed.

Incidentally, in the embodiment above, the case has been described where the exposure apparatus is a liquid immersion type exposure apparatus. However, the present invention is not limited to this, but can also be employed in a dry type exposure apparatus that performs exposure of wafer W without liquid (water).

A Second Embodiment

Next, a second embodiment of the present invention will be described, referring to FIGS. 15 to 23. Here, the same reference numerals will be used for the same or similar sections as in the first embodiment previously described, and a detailed description thereabout will be simplified or omitted.

Figure 15:
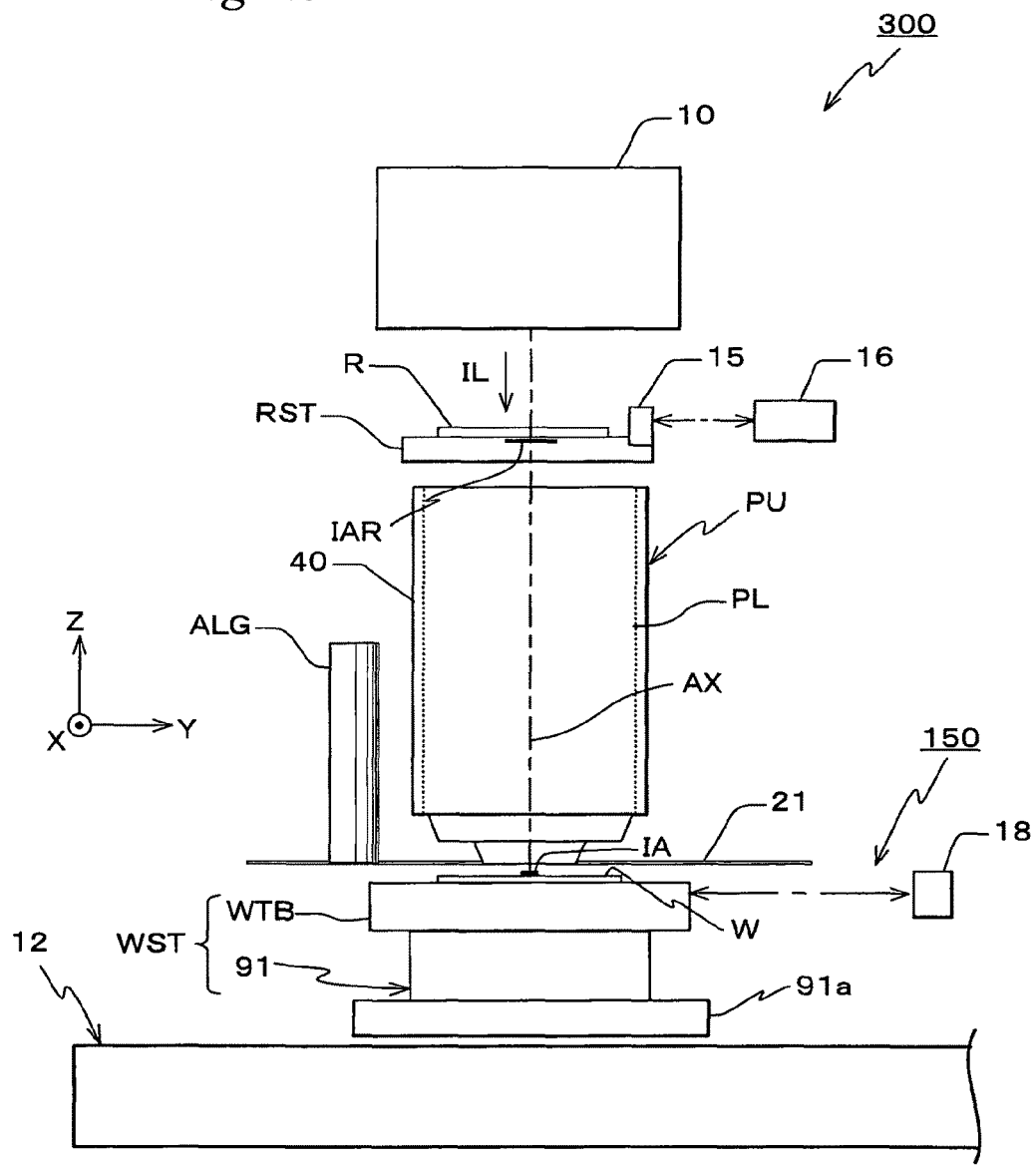
FIG. 15 is a view that schematically shows a configuration of an exposure apparatus of a second embodiment.

FIG. 15 shows a schematic configuration of an exposure apparatus 300 related to the second embodiment. Exposure apparatus 300 is a projection exposure apparatus of the step-and-scan method, namely the so-called scanner.

Exposure apparatus 300 is equipped with an illumination system 10, a reticle stage RST that holds a reticle R, a projection unit PU, a wafer stage device 150 that has a wafer stage WST on which a wafer W is mounted, and their control system, and the like. In exposure apparatus 300, the configuration of the encoder system which measures positional information of wafer stage WST is different from exposure apparatus 100 of the first embodiment. Further, the point where a local liquid immersion device is not installed in exposure apparatus 300 also differs from exposure apparatus 100.

In the periphery of the end on the −Z side of barrel 40 of projection unit PU, a scale plate 21 is placed parallel to the XY plane at a height substantially flush to the lower end surface of barrel 40. In the second embodiment, scale plate 21 consists of a rectangular plate having a circular opening into which the −Z side end of barrel 40 is inserted and a circular opening into which the −Z side end of an alignment system ALG is inserted in a part of the plate, and the plate is supported by suspension from a body (not shown). On the lower surface (a surface on the −Z side) of scale plate 21, a two-dimensional reflection grating RG (refer to FIG. 17) is formed, which consists of a grating of a predetermined pitch whose periodic direction is in the Y-axis direction, such as, a grating of 1 μm, and a grating of a predetermined pitch whose periodic direction is in the X-axis direction, such as, a grating of 1 μm.

Wafer stage device 150 is equipped with a base board 12 which is almost horizontally supported by a plurality of (for example, three or four) vibration isolation mechanisms (omitted in drawings) on the floor surface, wafer stage WST placed above of base board 12, a wafer stage drive system 27 (refer to FIG. 22) which drives wafer stage WST, an encoder system 170 (refer to FIG. 22), a wafer stage interferometer system (hereinafter shortly referred to as an interferometer system) 218 (refer to FIG. 22) and the like.

As shown in FIG. 15, wafer stage WST has a stage main section 91, and a wafer table WTB, which is placed above stage main section 91 and is supported in a non-contact manner to stage main section 91 by a Z tilt drive mechanism (not shown). In this case, wafer table WTB is supported in a non-contact manner by Z tilt drive mechanism by adjusting the balance of the upward force (repulsion) such as the electromagnetic force and the downward force (gravitation) including the self-weight at three points, and is also finely driven in directions of three degrees of freedom, which are the Z-axis direction, the θx direction, and the θy direction.

Wafer stage WST is supported by levitation above base board 12 by a predetermined clearance, such as around several μm, by a plurality of air bearings (not shown), and is driven in the X-axis direction, the Y-axis direction, and the θz direction by wafer stage drive system 27. Accordingly, wafer table WTB is drivable with respect to base board 12 in directions of six degrees of freedom.

On wafer table WTB, wafer W is mounted via a wafer holder (not shown), and is fixed by a chuck mechanism (not shown), such as, for example, vacuum suction (or electrostatic adsorption).

Further, a configuration is employed where positional information of wafer stage WST in the XY plane is measurable by encoder system 170. Hereinafter, details on a configuration and the like of encoder system 170 will be described.

In wafer table WTB, as shown in a planar view in FIG. 16, encoder heads (hereinafter, shortly referred to as a head, as needed) 60A to 60D are attached in the four corners, respectively. As is shown in FIG. 17, focusing on head 60C as a representative, these heads 60A to 60D are housed in a through-hole formed in the Z-axis direction in wafer table WTB, with the outgoing end of the measurement beam facing the +Z direction, and are fixed to wafer table WTB.

Figure 16:
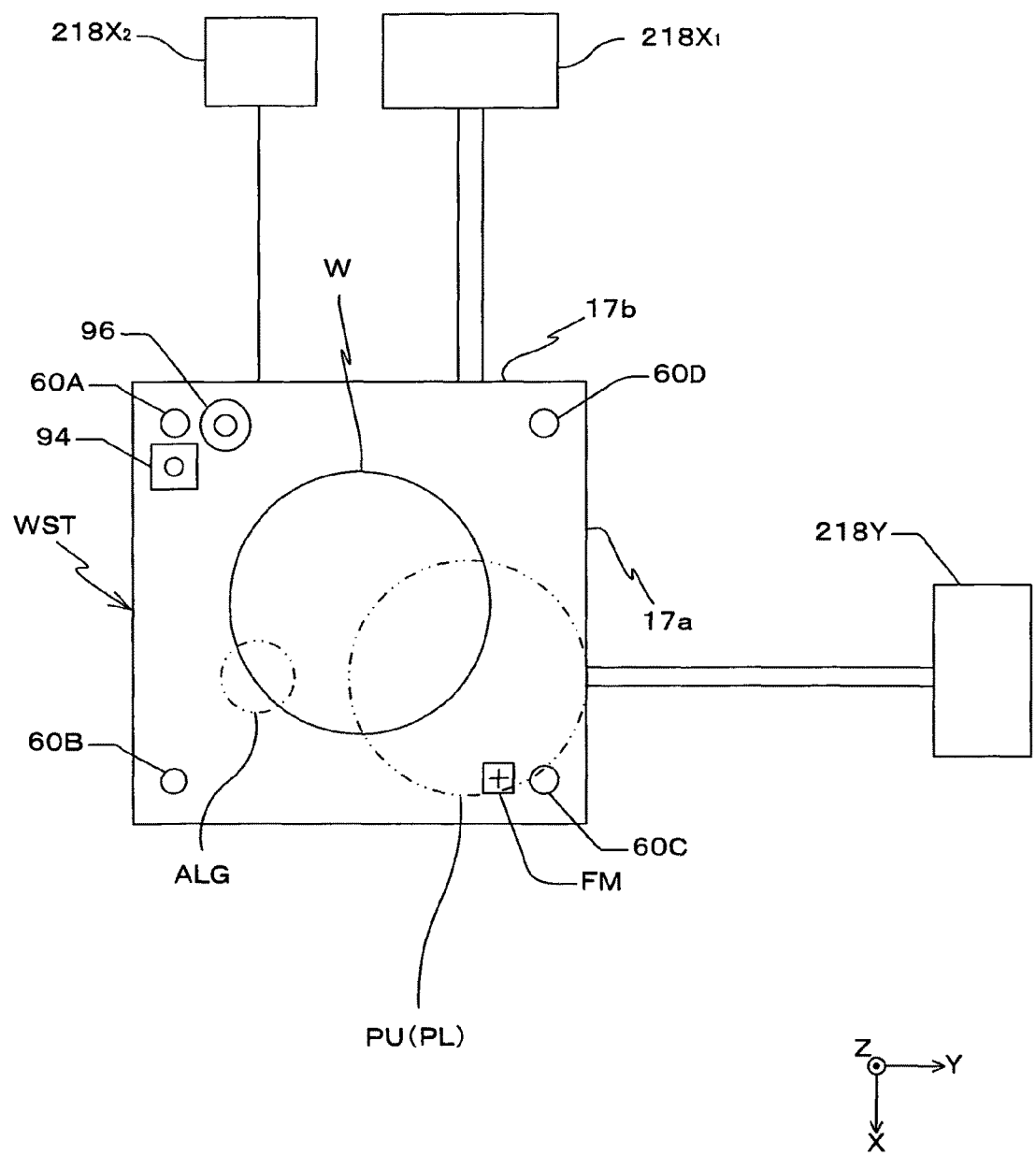
FIG. 16 is a view to explain a placement of an encoder head and an interferometer.
Figure 17:
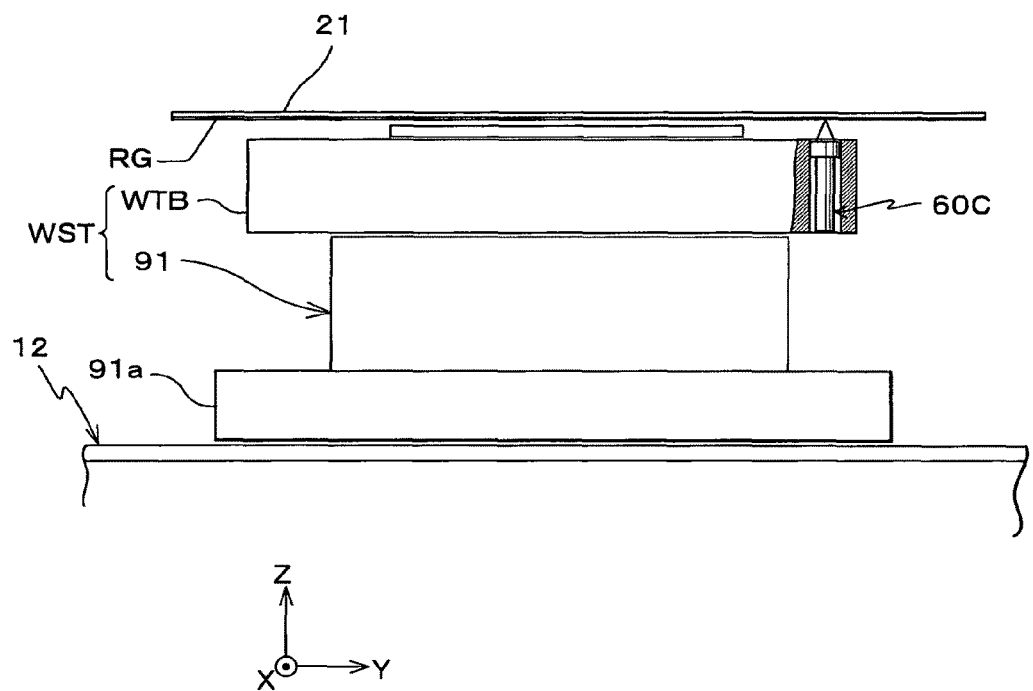
FIG. 17 is an enlarged view where a part of the wafer stage in FIG. 1 is fractured.

In FIG. 16, a pair of heads 60A and 60C, which is located on one of the diagonal lines of wafer table WTB, are heads whose measurement direction is in the Y-axis direction. Further, a pair of heads 60B and 60D, which is located on the other diagonal line of wafer table WTB, are heads whose measurement direction is in the X-axis direction. As each of the heads 60A to 60D, a head having a configuration similar to heads 64, 66 and the like of the first embodiment described earlier is used. A configuration similar to heads 60A to 60D is disclosed in, for example, U.S. Pat. No. 7,238,931, the pamphlet of International Publication No. 2007/083758 and the like. However, the light source and the photodetector that configure each head can be arranged outside each head and only the optical system may be arranged inside the main section of each head, and the light source, the photodetector, and the optical system can be optically connected via an optical communication channel including an optical fiber.

Heads 60A and 60C irradiate measurement beams (measurement lights) on the two-dimensional diffraction grating RG of scale plate 21, and receive the diffraction beams from the grating whose periodic direction is the Y-axis direction configuring the two-dimensional diffraction grating RG, and configure Y linear encoders 170A and 170C (refer to FIG. 22) which measure the position of wafer stage WST in the Y-axis direction, respectively. Further, heads 60B and 60D irradiate measurement beams on the two-dimensional diffraction grating RG of scale plate 21, and receive the diffraction beams from the grating whose periodic direction is the X-axis direction configuring the two-dimensional diffraction grating RG, and configure X linear encoders 170B and 170D (refer to FIG. 22) which measure the position of wafer stage WST in the X-axis direction, respectively.

Further, on wafer table WTB, as shown in FIG. 16, various types of measurement members are arranged, such as, for example, an uneven illuminance measuring sensor 94 that has a pinhole-shaped light-receiving section that receives illumination light IL on an image plane of projection optical system PL, an aerial image measuring instrument 96 that measures an aerial image (projected image) of a pattern that is projected by projection optical system PL, and a fiducial plate on which fiducial mark FM is formed. As such measurement members, for example, a wavefront aberration measuring instrument by the Shack-Hartman method that is disclosed in, for example, the pamphlet of International Publication No. 03/065428 and the like can be employed. In addition to each of the sensors described above, an illuminance monitor that has a light-receiving section having a predetermined area size that receives illumination light IL on the image plane of projection optical system PL may also be employed, which is disclosed in, for example, Kokai (Japanese Unexamined Patent Application Publication) No. 11-016816 (the corresponding U.S. Patent Application Publication No. 2002/0061469) and the like.

Figure 18A:
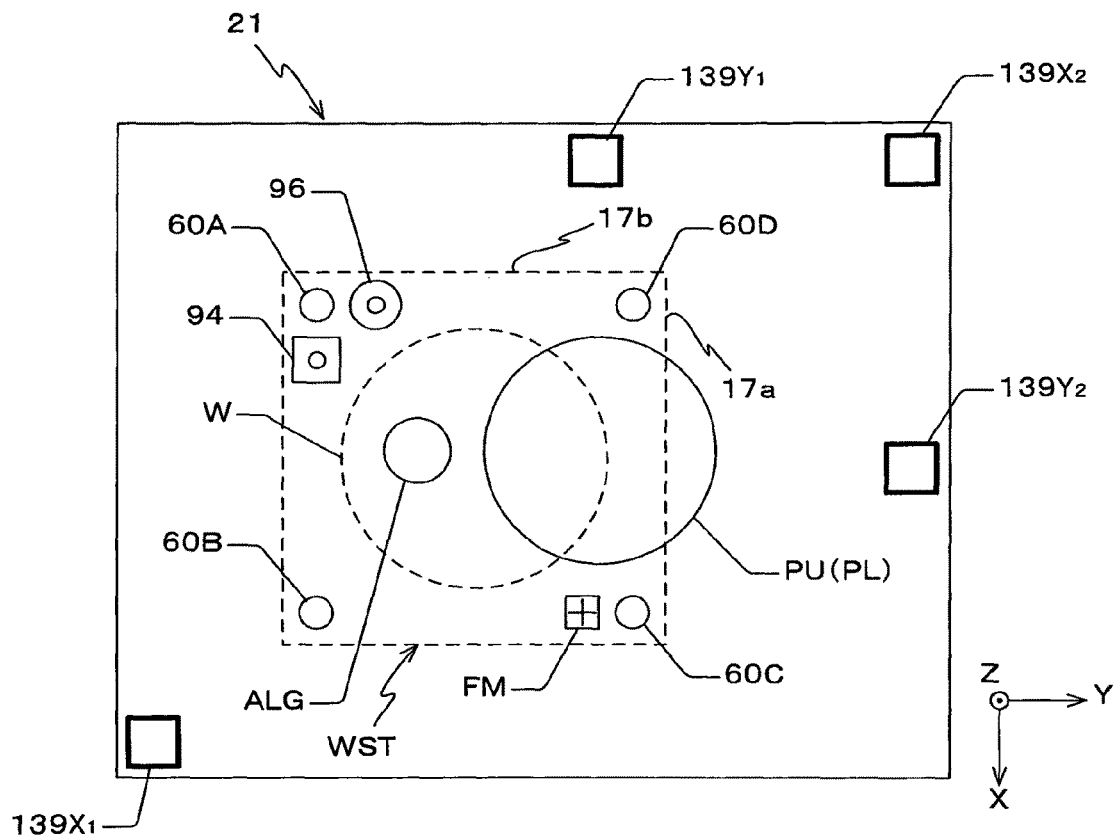
FIG. 18A is a planar view of the wafer stage device showing a placement and the like of a two-dimensional diffraction grating on the scale plate, an auxiliary scale, and the like, and FIG. 18B is a view showing a configuration example of the auxiliary scale.
Figure 18B:
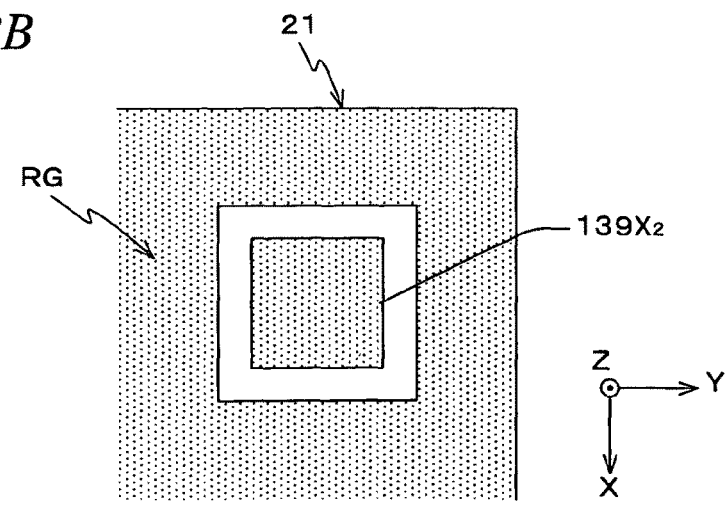

Further, on the lower surface (a surface on the −Z side) of scale plate 21, as shown in FIG. 18A, auxiliary scales $139Y_1$, $139Y_2$, $139X_1$, and $139X_2$ are formed within two-dimensional diffraction grating RG. In this case, as in auxiliary scale $139X_2$ shown enlarged in FIG. 18B, auxiliary scales $139Y_1$, $139Y_2$, $139X_1$, and $139X_2$ are surrounded by two-dimensional diffraction grating RG via a clearance area (an area without grid lines) of a predetermined size.

Auxiliary scales $139Y_1$ and $139Y_2$ are auxiliary scales used for calibration of heads 60A and 60C, respectively, and as shown in FIG. 18A, are placed on the −X side and +Y side within the two-dimensional diffraction grating RG, respectively. Incidentally, the positional relation between auxiliary scales $139Y_1$ and $139Y_2$ is approximately equal to the positional relation between heads 60A and 60C (refer to FIG. 23). Auxiliary scales $139Y_1$ and $139Y_2$ are each composed of a reflection grating (for example, a diffraction grating) having a periodic direction in the Y-axis direction similar to auxiliary scales $39Y_3$ and $39Y_4$ previously described. Further, auxiliary scales $139X_1$ and $139X_2$ are auxiliary scales used for calibration of heads 60B and 60D, respectively, and as shown in FIG. 18A, are placed in the vicinity of the edge on the +X and −Y side, and the edge on the −X side and +Y side within the two-dimensional diffraction grating RG, respectively. Incidentally, the positional relation of auxiliary scale $139X_2$ with auxiliary scales $139Y_1$ and $139Y_2$ is approximately equal to the positional relation of head 60D with heads 60A and 60C (refer to FIG. 23). Auxiliary scales $139X_1$ and $139X_2$ are similar to auxiliary scales $139Y_1$ and $139Y_2$, but are configured by a reflection grating (for example, a diffraction grating) whose periodic direction is in the X-axis direction. Incidentally, in FIG. 18A, base board 12 is omitted, for the sake of convenience. The same can be said for FIGS. 19 to 21 and for FIG. 23.

Figure 19A:
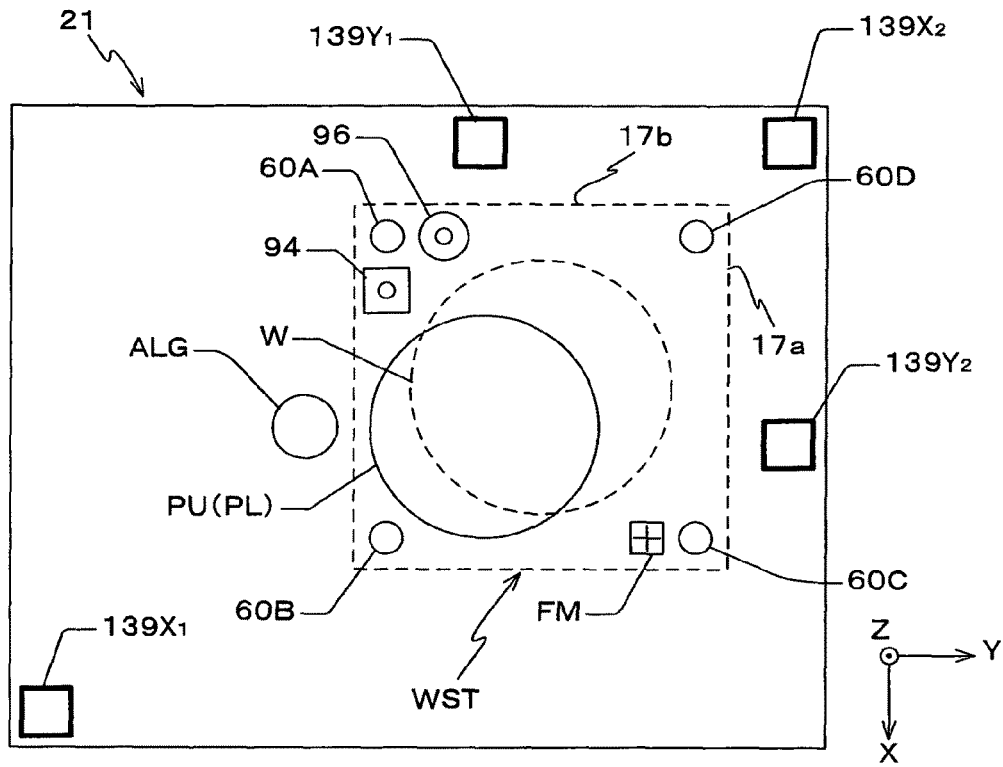
FIGS. 19A and 19B are planar views to explain placement of the auxiliary scales (No. 1 and No. 2)
Figure 19B:
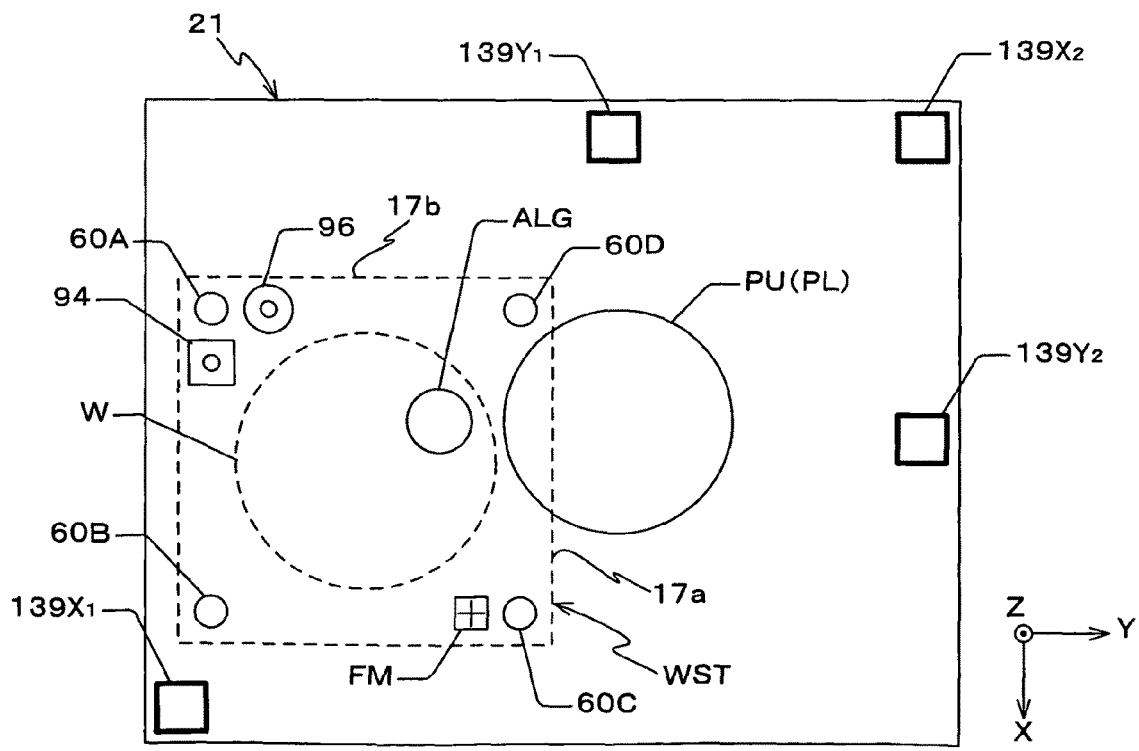
Figure 20A:
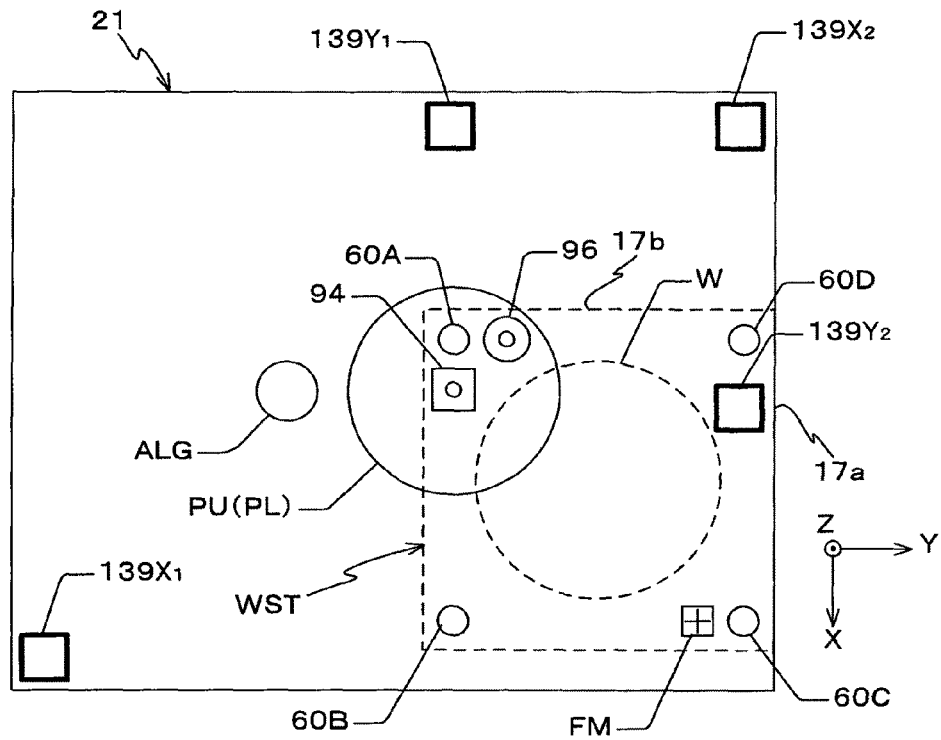
FIGS. 20A and 20B are planar views to explain placement of the auxiliary scales (No. 3 and No. 4)
Figure 20B:
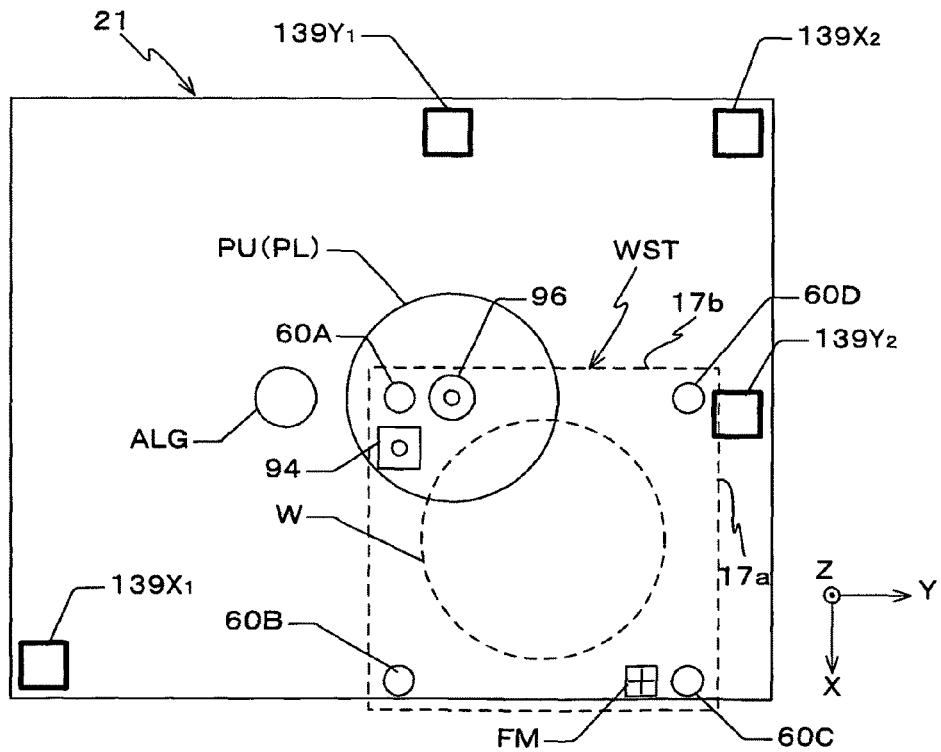
Figure 21A:
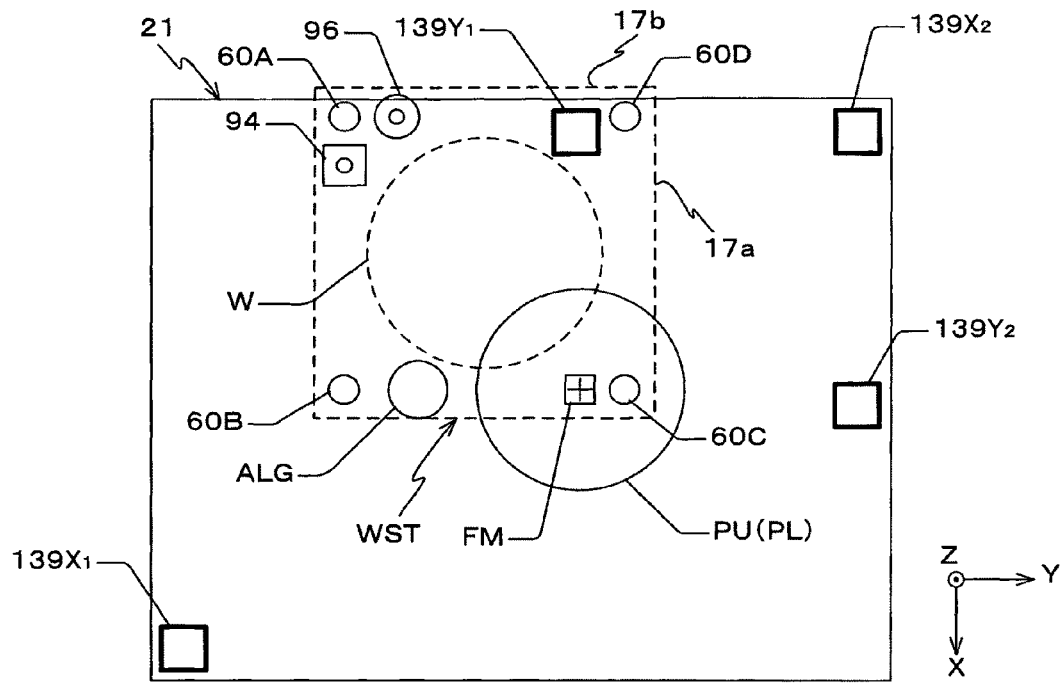
FIGS. 21A and 21B are planar views to explain placement of the auxiliary scales (No. 5 and No. 6)
Figure 21B:
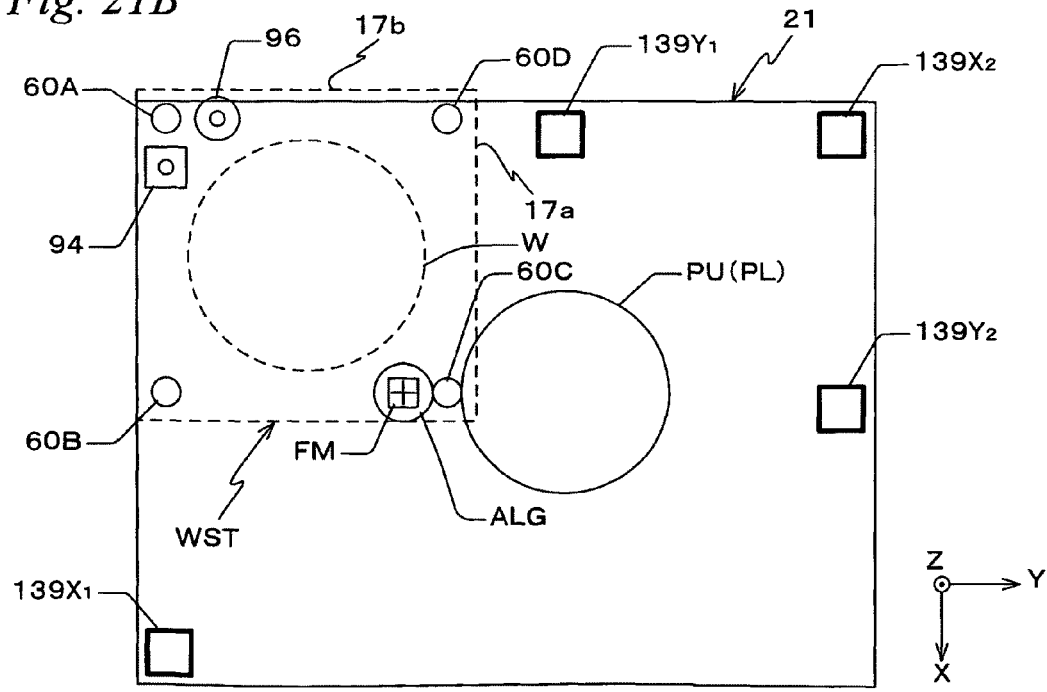

Incidentally, auxiliary scales $139Y_1$, $139Y_2$, $139X_1$, and $139X_2$ are placed at positions where they cannot be scanned by heads 60A, 60C, 60B, and 60D during the exposure shown in FIG. 19A and the alignment measurement shown in FIG. 19B. Further, in this placement of the auxiliary scales, auxiliary scales $139Y_1$, $139Y_2$, $139X_1$, and $139X_2$ cannot be scanned by heads 60A, 60C, 60B, and 60D even at the time of illuminance unevenness measurement of illumination light IL using uneven illuminance measuring sensor 94 shown in FIG. 20A, at the time of measurement of optical properties of projection optical system PL using aerial image measuring instrument 96 shown in FIG. 20B, or at the time of detection of fiducial mark FM using projection optical system PL and alignment system ALG shown in FIGS. 21A and 21B, respectively.

In the second embodiment, an area of a predetermined range including the area where auxiliary scales $139Y_1$, $139Y_2$, $139X_1$, and $139X_2$ are formed is a calibration area.

Further, in the second embodiment, a configuration is employed where the position of wafer table WTB can be measured with interferometer system 218 (refer to FIG. 22), independently from encoder system 170.

Figure 22:
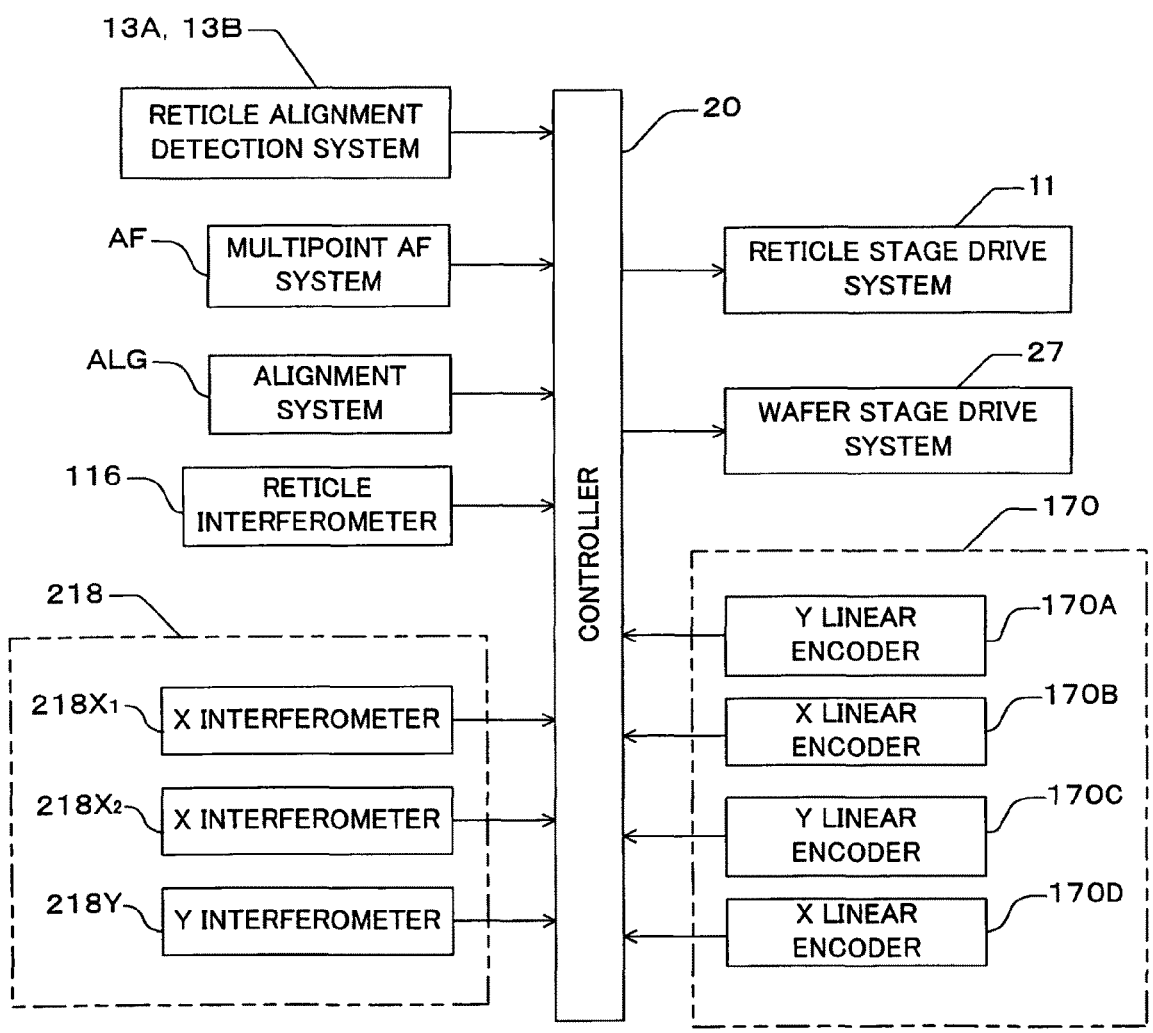
FIG. 22 is a block diagram showing the main configuration of the control system related with the stage control in the exposure apparatus of the second embodiment.

Interferometer system 218, as shown in FIG. 16, is equipped with at least one Y interferometer 218Y that irradiates a plurality of measurement beams in the Y-axis direction on a reflection surface 17A of wafer table WTB, and a plurality of, in this case, two X interferometers $218X_1$ and $218X_2$ that irradiate one or more than one measurement beams in the Y-axis direction on a reflection surface 17B (refer to FIGS. 16 and 22).

The substantial measurement axis in the Y-axis direction of Y interferometer 218Y is a straight line in the Y-axis direction which passes through optical axis AX of projection optical system PL and the detection center of alignment system ALG. Y interferometer 218Y measures the positional information of wafer table WTB in the Y-axis direction, the θz direction, and the θx direction.

Further, the substantial measurement axis in the X-axis direction of X interferometer $218X_1$ is a straight line in the X-axis direction which passes through optical axis AX of projection optical system PL. X interferometer $218X_1$ measures the positional information of wafer table WTB in the X-axis direction and in the θy direction (and the θz direction).

Further, the measurement axis of X interferometer $218X_2$ is a straight line in the X-axis direction which passes through the detection center of alignment system ALG. X interferometer $218X_1$ measures the positional information of wafer table WTB in the X-axis direction and in the θy direction.

Incidentally, for example, instead of reflection surfaces 17a and 17b described above, a movable mirror consisting of a plane mirror can be attached to the end of wafer table WTB. Further, a reflection surface 45 inclined at an angle of 45 degrees to the XY plane can be arranged on wafer table WTB, and the position of wafer table WTB in the Z-axis direction can be measured via the reflection surface.

The measurement values of each of the interferometers of interferometer system 218 are supplied to controller 20. However, in the second embodiment, the positional information (including positional information (rotation information) in the θz direction) in the XY plane of wafer stage WST (wafer table WTB) is mainly measured by encoder system 170, and the measurement values of interferometers 218Y, $218X_1$, and $218X_2$ are secondarily used in cases such as when performing calibration of encoder system 170 or as backup at the time of output abnormality in encoder system 170.

Alignment system ALG is placed on the −Y side of projection optical system PL away by a predetermined distance. As alignment system ALG, for example, an FIA (Field Image Alignment) system by an image processing method is used. The imaging signals from alignment system ALG are supplied to controller 20.

Incidentally, alignment system ALG is not limited to the FIA system, and an alignment sensor, which irradiates a coherent detection light to a subject mark and detects a scattered light or a diffracted light generated from the subject mark or makes two diffracted lights (for example, diffracted lights of the same order or diffracted lights being diffracted in the same direction) generated from the subject mark interfere and detects an interference light, can naturally be used alone or in combination as needed.

In addition, in exposure apparatus 300 of the second embodiment, a multipoint AF system AF (not shown in FIG. 15, refer to FIG. 22) similar to the multipoint AF system (90a, 90b) previously described is installed in the vicinity of projection unit PU. Multipoint AF system AF supplies detection signals via an AF signal processing system (not shown), to controller 20 (refer to FIG. 22). Controller 20 detects the positional information of the wafer W surface in the Z-axis direction at each detection point based on the detection signals of multipoint AF system AF, and based on the detection results, performs the so-called focus leveling control of wafer W during scanning exposure. Incidentally, a multipoint AF system can be arranged in the vicinity of alignment detection system ALG and surface position information (unevenness information) of the wafer surface can be acquired in advance at the time of wafer alignment, and at the time of exposure, the surface position information and the measurement values of another sensor detecting the position of wafer table WTB in the Z-axis direction can be used to perform the so-called focus leveling control of wafer W.

In exposure apparatus 300, furthermore, above reticle R, a pair of reticle alignment systems 13A and 13B (not shown in FIG. 15, refer to FIG. 22) is arranged, consisting of TTR (Through The Reticle) alignment systems which use light of the exposure wavelength. Reticle alignment detection systems 13A and 13B supply detection signals to controller 20 (refer to FIG. 22), via an alignment signal processing system (not shown).

FIG. 22 is a block diagram showing a partially omitted control system related to stage control in exposure apparatus 300. This control system is mainly configured of controller 20. Controller 20 includes a so-called microcomputer (or workstation) consisting of a CPU (Central Processing Unit), ROM (Read Only Memory), RAM (Random Access Memory) and the like, and has overall control over the entire apparatus.

In exposure apparatus 300 configured in the manner described above, on manufacturing devices, reticle alignment and baseline measurement of alignment system ALG are performed, in a procedure similar to an typical scanning stepper (a procedure disclosed in, for example, U.S. Pat. No. 5,646,413 and the like) using reticle alignment detection systems 13A and 13B, the fiducial plate (fiducial mark FM) on wafer table WTB and the like previously described, and around this time, wafer alignment (Enhanced Global Alignment (EGA) which is disclosed in, for example, U.S. Pat. No. 4,780,617 and the like) and the like are performed.

Then, controller 20 performs an exposure operation by the step-and-scan method, based on the measurement results of the baseline and the results of the wafer alignment, and a pattern of reticle R is transferred onto each of a plurality of shot areas on wafer W. This exposure operation is performed by alternately repeating a scanning exposure operation where synchronous movement of reticle stage RST and wafer stage WST previously described is performed, and a movement (stepping) operation between shots where wafer stage WST is moved to an acceleration starting position for exposure of the shot area.

During the scanning exposure described above, controller 20 controls the position of wafer table WTB within the XY plane, while measuring the positional information (including rotation information in the θz direction) within the XY plane of wafer table WTB using encoder system 170, and by driving the Z tilt drive mechanism (not shown) based on the measurement values of multipoint AF system AF, controller 20 performs the so-called focus leveling control of wafer W where a part (an area corresponding to exposure area IA) of the shot area subject to exposure of wafer W is made to be coincident within the depth of focus of projection optical system PL.

Therefore, according to exposure apparatus 300, the position (including rotation in the θz direction) of wafer stage WST within the XY plane can be controlled with high precision based on the measurement information of each of the encoders of encoder system 170, while performing the so-called focus leveling control of wafer W.

Further, in exposure apparatus 300, for example, when measuring an aerial image of a measurement mark formed on the reticle or on a mark plate on reticle stage RST using aerial image measuring instrument 96, a projection image (an aerial image) of the measurement mark by projection optical system PL is measured by a slit scan method, in a state where the aerial image measuring instrument is located right under projection optical system PL, as shown in view 20B.

In this case, in this second embodiment, when wafer stage WST is located in the vicinity of the edge on the −X and the +Y sides of base board 12, heads 60A, 60C, and 60D face auxiliary scales $139Y_1$, $139Y_2$, and $139X_2$, respectively. Incidentally, at this point, uneven illuminance measuring sensor 94, aerial image measuring instrument 96, and fiducial mark FM installed in wafer stage WST are not located below projection optical system PL. Accordingly, controller 20 can move wafer stage WST to the vicinity of the edge on the −X and the +Y sides of base board 12, while measuring the position of wafer stage WST using interferometer system 218, and can measure positional information of auxiliary scales $139Y_1$, $139Y_2$, and $139X_2$ in a similar manner as in the first embodiment previously described, using heads 60A, 60C, and 60D. More specifically, calibration (position measurement) of heads 60A, 60C, and 60D can be performed.

Figure 23A:
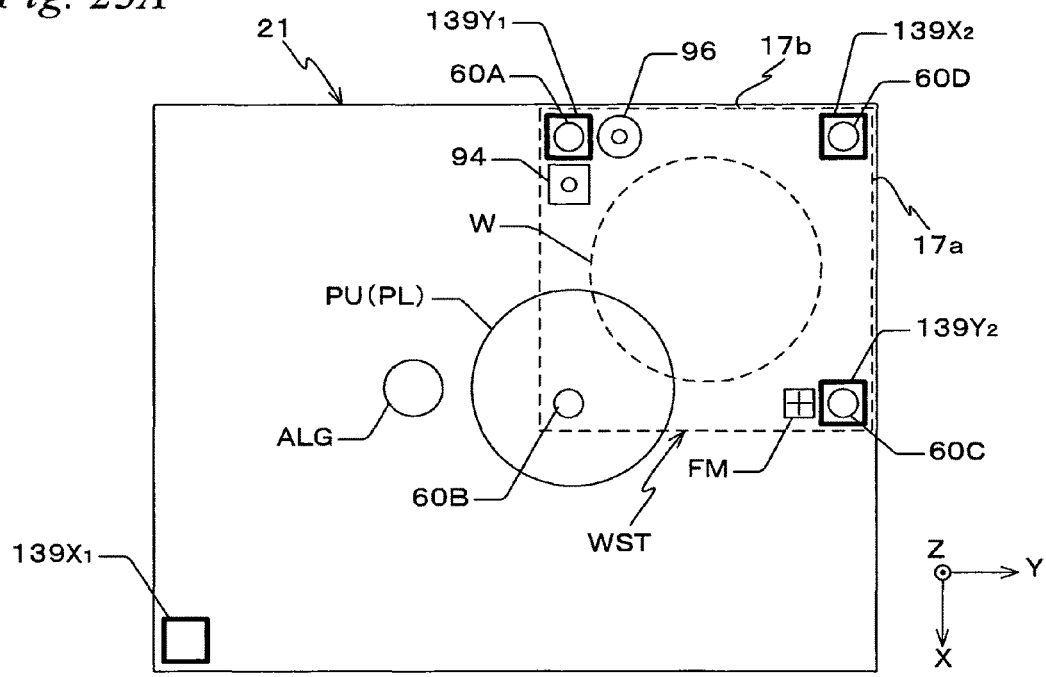
FIGS. 23A and 23B are views (No. 1 and No. 2) for describing an operation of the exposure apparatus related to the second embodiment.
Figure 23B:
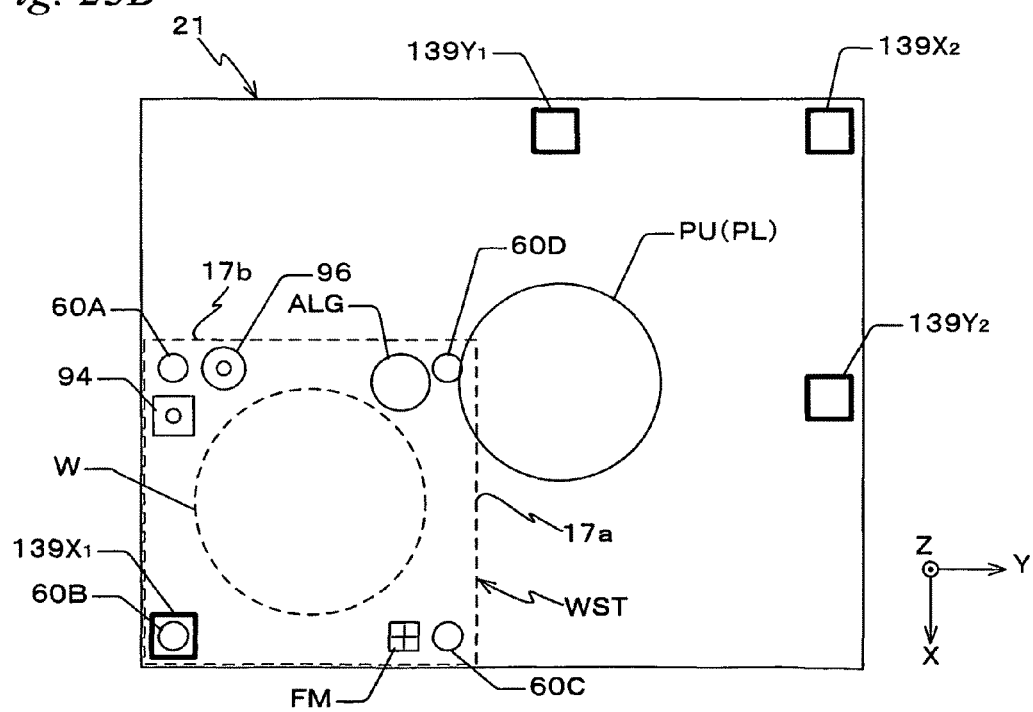

Further, in the second embodiment, as shown in FIG. 23B, when wafer stage WST is located in the vicinity of the edge on the +X and −Y edge on base board 12, head 60B faces auxiliary scale $139X_1$. Incidentally, at this point, uneven illuminance measuring sensor 94, aerial image measuring instrument 96, and fiducial mark FM installed in wafer stage WST are not located below alignment system ALG. Accordingly, controller 20 can move wafer stage WST to the vicinity of the end on the +X and the −Y sides of base board 12, while measuring the position of wafer stage WST using interferometer system 218, and can measure positional information of auxiliary scale $139X_1$ in a similar manner as in the first embodiment previously described, using head 60B. More specifically, calibration (position measurement) of head 60B can be performed.

As discussed above, according to exposure apparatus 300 of the second embodiment, an equivalent effect as the first embodiment can be obtained except for the point that a dry exposure is performed by the non-liquid immersion method and not by the liquid immersion method. Moreover, according to exposure apparatus 300, at a predetermined time when transfer/formation of the pattern of reticle R to wafer W, or more specifically, both exposure by the step-and-scan method and the detection (alignment measurement) of alignment marks on wafer W using the alignment ALG are not performed, a calibration area including auxiliary scales $139Y_1$, $139Y_2$, $139X_1$, and $139X_2$ is arranged at a position on a surface on the −Z side of scale plate 21 where heads 60A, 60C, 60B, and 60D face. Therefore, because of the presence of the calibration area, while the measurement operation of the positional information of wafer table WTB by heads 60A, 60C, 60B, and 60D does not receive bad influence at the time of regular movement of wafer stage WST, calibration of encoder system 170 can be performed when both the alignment measurement and the exposure operation are not performed.

Incidentally, in the second embodiment, while an example was described of a dry exposure apparatus by the non-liquid immersion method, besides such an apparatus, a local liquid immersion device and the like similar to the one described in the first embodiment can be arranged in an exposure apparatus that is equipped with an encoder system which has a head arranged at wafer table WTB and a scale plate having an auxiliary scale and the like (a calibration area) arranged outside wafer table WTB, similar to exposure apparatus 300 of the second embodiment described above.

Incidentally, in the second embodiment described above, while the case has been described where encoder system 170 is equipped with a pair of X heads and a pair of Y heads, the present invention is not limited to this. More specifically, the number of encoder heads need not be specified; however, to measure the positional information (including rotation in the θz direction) of wafer stage WST in the XY plane, the encoder should have a total of three heads, including at least one X head and one Y head each. Further, as an encoder head, in the case of using a two-dimensional encoder head (a 2D head) whose measurement directions are in the X-axis direction and the Y-axis direction, at least two of the 2D heads should be arranged on wafer stage WST.

Incidentally, in each of the embodiments above, the case has been described where the present invention is applied to a scanning exposure apparatus by a step-and-scan method or the like. However, the present invention is not limited to this, but may also be applied to a static exposure apparatus such as a stepper. Even with the stepper or the like, by measuring the position of a stage on which an object subject to exposure is mounted by encoders, generation of position measurement error caused by air fluctuations can substantially be nulled likewise. In this case, it becomes possible to set the position of the stage with high precision based on correction information used to correct short-term fluctuation of the measurement values of the encoders using the measurement values of the interferometers and based on the measurement values of the encoders, and as a consequence, highly accurate transfer of a reticle pattern onto the object can be performed. Further, the present invention can also be applied to an exposure apparatus by a step-and-stitch method that synthesizes a shot area and a shot area. Furthermore, the present invention can also be applied to a multi-stage type exposure apparatus equipped with a plurality of wafer stages, as is disclosed in, for example, Kokai (Japanese Unexamined Patent Application Publication) No. 10-163099 and No. 10-214783 (the corresponding U.S. Pat. No. 6,590,634), Kohyo (published Japanese translation of International Publication for Patent Application) No. 2000-505958 (the corresponding U.S. Pat. No. 5,969,441), the U.S. Pat. No. 6,208,407 and the like. Especially in the case of a multi-stage type exposure apparatus, the wafer stage can be driven by a planar motor.

Further, the magnification of the projection optical system in the exposure apparatus of each of the embodiments above is not limited only to a reduction system, but also can be either an equal magnifying system or a magnifying system, and the projection optical system is not limited only to a dioptric system, but also can be either a catoptric system or a catadioptric system, and the projected image can be either an inverted image or an upright image.

Further, illumination light IL is not limited to an ArF excimer laser beam (wavelength 193 nm), and can also be an ultraviolet light such as the KrF excimer laser beam (wavelength 248 nm), or a vacuum-ultraviolet light such as the $F_2$ laser beam (wavelength 157 nm). As disclosed in, for example, the pamphlet of International Publication No. 99/46835 (the corresponding U.S. Pat. No. 7,023,610), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides such an apparatus, the present invention can also be applied to an exposure apparatus that uses charged particle beams such as an electron beam or an ion beam.

Further, in each of the embodiments above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257 description, an electron mask (which is also called a variable shaped mask, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used.

Further, as disclosed in the pamphlet of International Publication No. 01/035168, the present invention can also be applied to an exposure apparatus (lithography system) that forms line-and-space patterns on a wafer by forming interference fringes on the wafer.

Moreover, the present invention can also be applied to an exposure apparatus that synthesizes two reticle patterns on a wafer via a projection optical system and almost simultaneously performs double exposure of one shot area by one scanning exposure, as is disclosed in, for example, Kohyo (published Japanese translation of International Publication for Patent Application) No. 2004-519850 (the corresponding U.S. Pat. No. 6,611,316).

Further, an apparatus that forms a pattern on an object is not limited to the exposure apparatus (lithography system) described above, and for example, the present invention can also be applied to an apparatus that forms a pattern on an object by an ink-jet method.

Incidentally, in each of the embodiments above, the object (an object subject to exposure which is irradiated with an energy beam) on which the pattern is to be formed is not limited to wafers, and other objects can also be used such as glass plates, ceramic substrates, or mask blanks.

The use of the exposure apparatus is not limited only to the exposure apparatus for manufacturing semiconductor devices, but the present invention can also be widely applied to an exposure apparatus for transferring a liquid crystal display device pattern onto a rectangular glass plate and an exposure apparatus for producing organic ELs, thin magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a reticle or mask used in a light exposure apparatus, an EUV exposure apparatus, an X-ray exposure apparatus, an electron-beam exposure apparatus, and the like.

Further, the exposure apparatus of the embodiment above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the disclosures of the various publications, the pamphlets of the International Publications, and the U.S. patent application Publication descriptions and the U.S. patent descriptions that are cited in the embodiment above and related to exposure apparatuses and the like are each incorporated herein by reference.

Incidentally, semiconductor devices are manufactured through the steps of a step where the function/performance design of the wafer is performed, a step where a reticle based on the design step is manufactured, a step where a wafer is manufactured using silicon materials, a lithography step where the pattern formed on the reticle by the exposure apparatus in each of the embodiments above is transferred onto an object such as the wafer, a device assembly step (including processes such as a dicing process, a bonding process, and a packaging process), inspection steps and the like. In this case, because a device pattern is formed on the object using the exposure apparatus in each of the embodiments above in the lithography step, it becomes possible to improve the productivity of highly integrated devices.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A position measurement system which measures positional information of a movable body moving within a predetermined plane, the system comprising:
    a first grating located on a predetermined planar surface parallel to the predetermined plane, of one of the movable body and an outside of the movable body, the first grating having a periodic direction in a predetermined direction;
    a calibration area located on the predetermined planar surface at a position which is different from a position of the first grating; and
    an encoder that has at least one head arranged at the other of the movable body and the outside of the movable body, and measures positional information of the movable body in the predetermined direction, based on an output of a head that faces the first grating.

2. The position measurement system according to claim 1 further comprising:
    a second grating located in the calibration area, the second grating having a periodic direction in the predetermined direction and having a size in the periodic direction that is smaller than a size of the first grating in the periodic direction.

3. The position measurement system according to claim 2 wherein
    the head includes an irradiation system which irradiates a light beam in the predetermined direction on an opposing grating of the first grating and the second grating, and a photodetection system which receives a diffraction light from the opposing grating.

4. The position measurement system according to claim 3 wherein
    the first grating is arranged on one surface of the movable body, and the second grating is arranged on the one surface of the movable body spaced apart from the first grating in the predetermined direction by a predetermined distance.

5. The position measurement system according to claim 4 wherein
    a size of the light beam in the predetermined direction is smaller than the size of the second grating in the predetermined direction, and is also smaller than the predetermined distance.

6. The position measurement system according to claim 4, further comprising:
    a controller which receives a photoelectric conversion signal of the photodetection system of the head opposing the second grating while driving the movable body in the predetermined direction within the predetermined plane, and based on the photoelectric conversion signal and a predetermined threshold, computes positional information in the predetermined direction of a reference point on the movable body.

7. The position measurement system according to claim 6 wherein
    the controller drives the movable body in the predetermined direction within the predetermined plane in a range where the light beam from the head crosses from one end of the second grating in the predetermined direction to an other end of the second grating, and during the drive of the movable body, receives the photoelectric conversion signal of the photodetection system which receives diffraction light from the grating, and based on the photoelectric conversion signal and the predetermined threshold, computes positional information of a midpoint in the predetermined direction of the second grating, as the positional information of the reference point in the predetermined direction.

8. The position measurement system according to claim 6 wherein
    the encoder has a plurality of heads placed at different positions on a plane parallel to the predetermined planar surface, and
    the controller drives the movable body in the predetermined direction along a path where each of the plurality of heads faces the second grating, receives a photoelectric conversion signal of the photodetection system of each head facing the second grating, and measures positional information of the reference point of the movable body in the predetermined direction using the plurality of heads, based on the photoelectric conversion signals and the predetermined threshold.

9. An exposure apparatus that exposes an object to form a predetermined pattern on the object, the apparatus comprising:
    a movable body which holds the object and moves within a predetermined plane; and
    the position measurement system according to claim 1 which measures positional information of the movable body.

10. A position measurement system which measures positional information of a movable body moving within a predetermined plane, the system comprising:
    a grating which is located on a predetermined planar surface parallel to the predetermined plane, the grating having a periodic direction in a predetermined direction; and
    a calibration area which is located on the predetermined planar surface on one side of the grating in the predetermined direction.

11. An exposure apparatus that exposes an object to form a predetermined pattern on the object, the apparatus comprising:
    a movable body which holds the object and moves within a predetermined plane; and
    the position measurement system according to claim 10 which measures positional information of the movable body.

12. An exposure apparatus that exposes an object to form a predetermined pattern on the object, the apparatus comprising:
- a movable body which holds the object and moves within a predetermined plane;
- a first grating located on a predetermined planar surface parallel to the predetermined plane, of one of the movable body and an outside of the movable body, the first grating having a periodic direction in a predetermined direction;
- an encoder that has at least one head arranged at the other of the movable body and the outside of the movable body, and measures positional information of the movable body in the predetermined direction, based on an output of a head that faces the first grating;
- a pattern generation device which forms a pattern on the object;
- a mark detection device that detects marks on the object; and
- a calibration area located at a position on the predetermined planar surface where the head faces at a predetermined time when neither formation of the pattern on the object by the pattern generation device nor detection of a mark on the object by the mark detection device is performed,
- wherein the calibration area is located on the predetermined planar surface at a position which is different from a position of the first grating.

13. The exposure apparatus according to claim 12 further comprising:
- a second grating located in the calibration area, the second grating having a periodic direction in the predetermined direction and having a size in the periodic direction that is smaller than a size of the first grating in the periodic direction.

14. The exposure apparatus according to claim 12 wherein the head includes an irradiation system which irradiates a light beam in the predetermined direction on an opposing grating of the first grating and the second grating, and a photodetection system which receives a diffraction light from the opposing grating.

15. The exposure apparatus according to claim 12 wherein the first grating is located on the predetermined planar surface outside of the movable body, and a plurality of heads are also placed at different positions on a surface of the movable body facing the predetermined planar surface, whereby
- when a predetermined one of the plurality of heads is located in a vicinity of an exposure position, the calibration area is placed at a position on the predetermined planar surface where the remaining heads face.

16. A position measuring method that measures positional information of a movable body moving within a predetermined plane, the method comprising:
- a first process in which on a grating section located on a predetermined planar surface parallel to the predetermined plane, of one of the movable body and an outside of the movable body, and having a periodic direction in a predetermined direction, a light beam is irradiated from a head of an encoder arranged at the other of the movable body and the outside of the movable body, and a photoelectric conversion signal of a photodetection system receiving diffraction light from the grating section is received, while driving the movable body in the predetermined direction within the predetermined plane; and
- a second process in which positional information of a reference point of the grating section in the predetermined direction is computed, based on the photoelectric conversion signal and a predetermined threshold.

17. The position measuring method according to claim 16 wherein
- in the first process, while the movable body is driven in the predetermined direction within the predetermined plane in a range where the light beam from the head crosses from one end of the grating section in the predetermined direction to an other end of the grating section, the photoelectric conversion signal of the photodetection system which receives the diffraction light from the grating section is received during the drive, and
- in the second process, based on the photoelectric conversion signal and the predetermined threshold, positional information of a midpoint in the predetermined direction of the grating section is computed, as the positional information of the reference point in the predetermined direction.

18. The position measuring method according to claim 16 wherein
- the encoder has a plurality of heads placed at different positions on the other of the movable body and the outside of the movable body, and
- the processing in the first process and the second process is performed for each of the plurality of heads.

19. The position measuring method according to claim 16 wherein
- the grating section is located on the movable body, and the head is located external to the movable body.

20. The position measuring method according to claim 19 wherein
- on the movable body, the grating section is arranged as a pair of grating sections separated from each other in a direction orthogonal to the predetermined direction,
- in the first process, a light beam is irradiated from heads of a pair of encoders onto the pair of grating sections, respectively, and photoelectric conversion signals of a pair of photodetection systems which receive diffraction light from the pair of grating sections individually are received while the movable body is driven in the predetermined direction, and
- in the second process, positional information of a pair of reference points on the movable body in the predetermined direction is computed, based on the photoelectric conversion signals of the pair of photodetection systems and predetermined thresholds, the method further comprising:
- a third process in which rotation of the movable body within the predetermined plane is computed, based on the positional information of the pair of reference points in the predetermined direction.

21. The position measuring method according to claim 16 wherein
- in the first process, a light beam elongated in the predetermined direction is used as the light beam.

22. The position measuring method according to claim 21 wherein
- a size of the light beam in the predetermined direction is smaller than a size of the grating section in the predetermined direction.

23. An exposure method in which a predetermined pattern is formed on an object by exposing the object, the method comprising:
- a process in which positional information of a movable body that moves within a predetermined plane and that holds the object is measured using the position measuring method according to claim 16; and a process in which a position of the movable body is controlled, taking into consideration the measurement results for formation of the pattern on the object.

24. A device manufacturing method, comprising:

a process in which an object is exposed to form a pattern on the object, using the exposure method according to claim 23; and a process in which the object on which the pattern has been formed is developed.

25. A tool installed on a movable body that moves in a predetermined plane and which can face a head of an encoder and a mark detection system from a same direction, the tool comprising:

a plate formed of an optically-transparent material and having first and second oppositely-facing surfaces that are parallel to the predetermined plane in which the movable body moves, a mark detectable by the mark detection system formed on the first surface of the plate, and a grating which the head can face formed on the second surface of the plate at a position excluding an area where the mark faces.

26. The tool according to claim 25 wherein the plate is a glass wafer.

27. The tool according to claim 25 further comprising a light-shielding film formed on the second surface of the plate in an area underlying the mark.

28. A measuring method comprising:

a first process in which the tool according to claim 25 is installed on a movable body which can face a head of an encoder and a mark detection system from a same direction;

a second process in which positional information of the mark is detected by the mark detection system by driving the movable body;

a third process in which the movable body is driven so as to make the head of the encoder face the grating, and positional information of the grating is detected based on an output of the head; and a fourth process in which a positional relation between a detection center of the mark detection system and the head is computed, based on a positional relation between the mark and the grating, the positional information of the mark detected in the second process, and the positional information of the grating detected in the third process.

29. The measuring method according to claim 28 wherein the encoder has a plurality of heads, in the third process, the plurality of heads is made to face the grating sequentially, and based on an output of the head opposing the grating, a plurality of positional information of the grating is detected sequentially, and in the fourth process, a positional relation between a detection center of the mark detection system and each of the plurality of heads is computed, based on a positional relation between the mark and the grating, the positional information of the mark detected in the second process, and the plurality of positional information of the grating detected in the third process.

* * * * *